(12) United States Patent
Kushida

(10) Patent No.: US 7,984,363 B2
(45) Date of Patent: Jul. 19, 2011

(54) INTEGRATED CIRCUIT DEVICE INCLUDING A CIRCUIT TO GENERATE ERROR CORRECTION CODE FOR CORRECTING ERROR BIT FOR EACH OF MEMORY CIRCUITS

(75) Inventor: Keiichi Kushida, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1020 days.

(21) Appl. No.: 11/832,883

(22) Filed: Aug. 2, 2007

(65) Prior Publication Data

US 2008/0082892 A1 Apr. 3, 2008

(30) Foreign Application Priority Data

Sep. 29, 2006 (JP) ................................. 2006-268072

(51) Int. Cl.
*H03M 13/00* (2006.01)

(52) U.S. Cl. .......................... 714/776; 714/800; 714/758

(58) Field of Classification Search .................. 714/776, 714/800, 763, 758, 762, 701, 755, 8
See application file for complete search history.

(56) References Cited

U.S. PATENT DOCUMENTS

| 6,167,548 | A | * | 12/2000 | Yamakura | 714/763 |
| 6,185,718 | B1 | * | 2/2001 | Dell et al. | 714/800 |
| 6,546,489 | B1 | * | 4/2003 | Frank et al. | 713/187 |
| 6,662,333 | B1 | | 12/2003 | Zhang et al. | |
| 6,829,722 | B2 | * | 12/2004 | Lin | 714/8 |
| 7,620,784 | B2 | * | 11/2009 | Panabaker | 711/157 |

FOREIGN PATENT DOCUMENTS

JP 2001-249854 9/2001

* cited by examiner

*Primary Examiner* — Fritz Alphonse
(74) *Attorney, Agent, or Firm* — Oblon, Spivak, McClelland, Maier & Neustadt, L.L.P.

(57) ABSTRACT

An integrated circuit device includes a plurality of memory circuits, a memory hibernation state control circuit to bring the memory circuits into a hibernation state in response to an external command, a state controller which indicates an interrupt in a memory circuit in a hibernation state, and a plurality of partial error checking and correcting (ECC) code generating circuits which are provided for the memory circuits, respectively, to code hold data of an address of a memory circuit in a hibernation state in accordance with a rule of a Hamming code determinant by an interrupt in the memory circuit in the hibernation state. The integrated circuit device further includes a code storage memory which obtains ECC code data corresponding to all of the hold data based on partial ECC codes coded by the partial ECC code generating circuit and stores the ECC code data in a corresponding address.

20 Claims, 21 Drawing Sheets

FIG. 4

Generation of codes (address n)      Completion of coding

| Macro1 | Macro2 | Macro3 | .... | Macro8 | |
|---|---|---|---|---|---|
| R | R | R | | R | → Code1_get 1 |
| NOP→Rn | NOP→Rn | R | | R | → Code2_get 1,2 |
| R | R | R | | R | |
| : | : | : | | : | ... |
| NOP | R | R | | NOP→Rn | → Code8_get 1,2,4-8 |
| NOP | NOP | NOP→Rn | | R | → Code3_get 1-8 |
| : | : | : | | : | |

Completion of coding

| Macro1 | f1n | Macro2 | f2n | Macro3 | f3n | ... | Macro8 | f4n | |
|---|---|---|---|---|---|---|---|---|---|
| R | 1 | R | 1 | R | 1 | | R | 1 | → Code1_get 1 |
| NOP→Rn | 1 | R | 1 | R | 1 | | R | 1 | → Code2_get 1,2 |
| R | 1 | NOP→Rn | 1 | R | 1 | | R | 1 | → Code3_get 1,2,4-8 (Code3_Rewritted) |
| R | 1 | R | 1 | NOP→Rn | 0 | | R | 1 | |
| : | : | Wn | | R | 0 | | : | : | ... |
| NOP | 1 | R | 1 | R | 1 | | NOP→Rn | 1 | → Code8_get 1,2,4-8 |
| NOP | 1 | R | 1 | NOP→Rn | 1 | | R | 1 | → Code3_get 1-8 |
| : | : | : | | : | | | : | : | |

311a

311

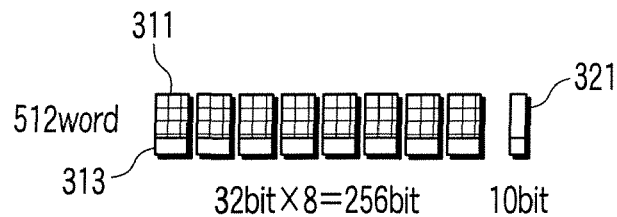

Macro of 16kb×8:

- Increase in flag bit: 8bit (3.1%)
- Code storage memory: 10bit (3.9%)
- Partial ECC code generating/decoding circuit (about 3%)
- Other peripheral circuits (about 1%)

Total: + about 11.0%
(Prior art: 22% increase only by code storage memory)

FIG. 8

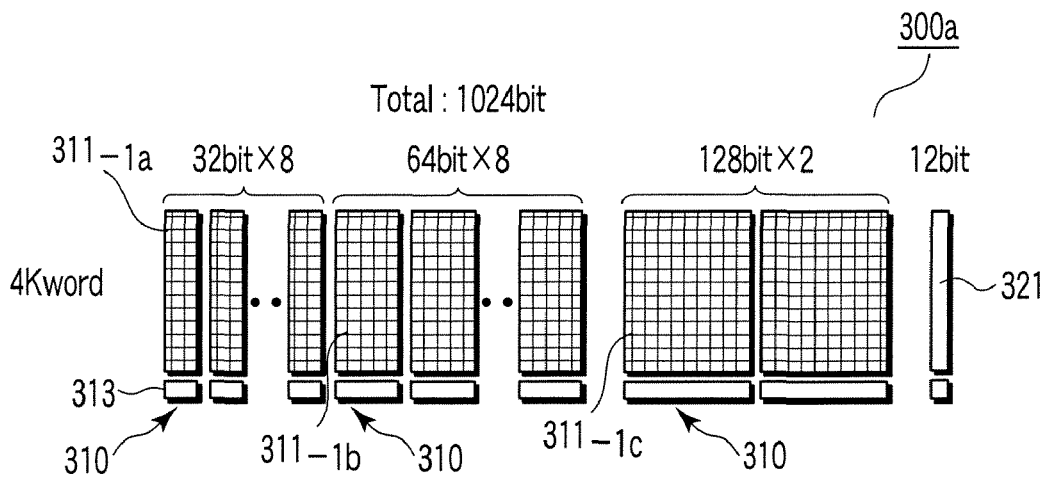

Macros of 128kb×8, 256kb×8, 512kb×2:

- Increase in flag bit: 18bit (1.8%)
- Code storage memory: 12bit (1.2%)
- Partial ECC code generating/decoding circuit (about 1%)
- Other peripheral circuits (about 1%)

Total: + about 5.0%

FIG. 9

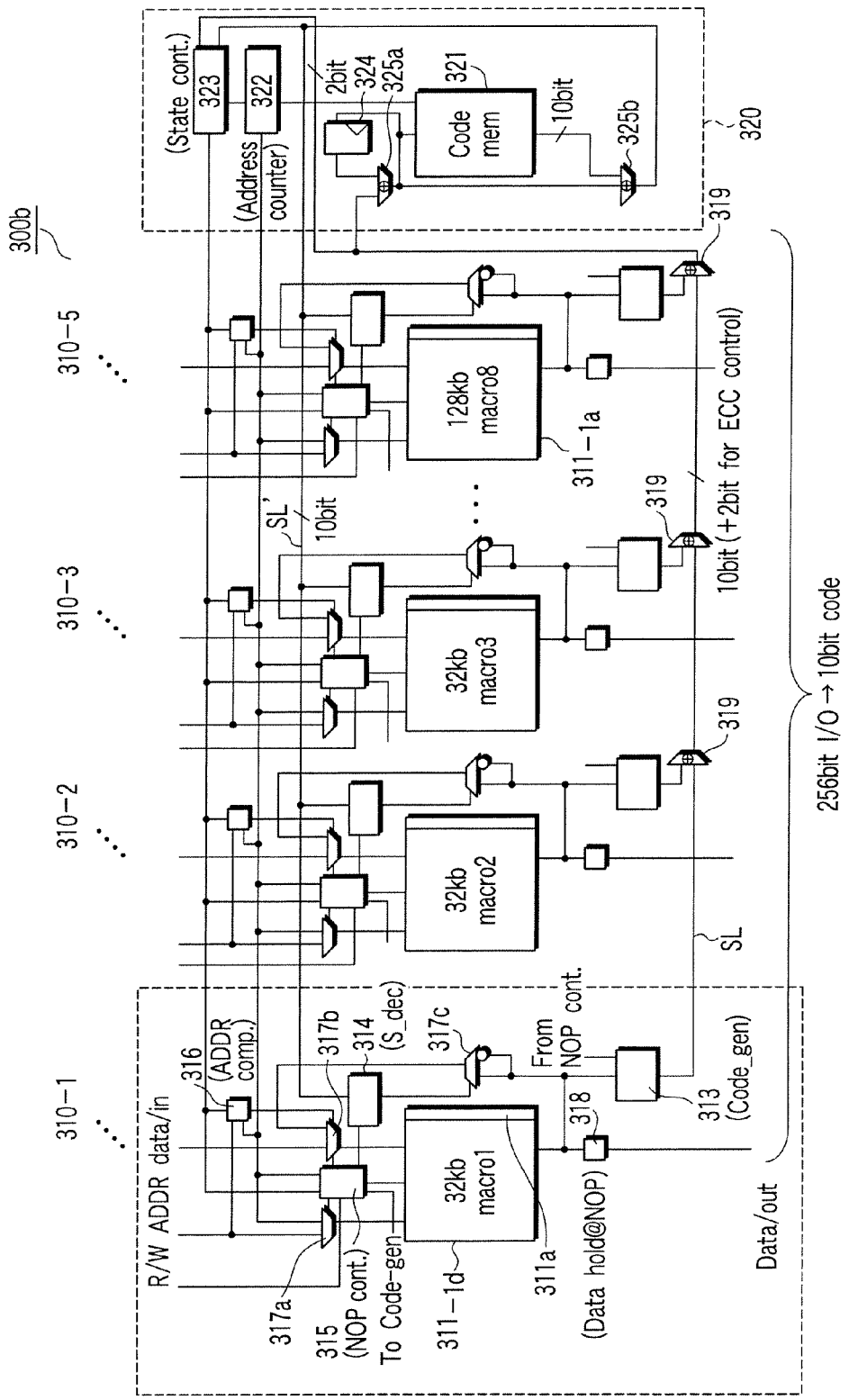
F I G. 10

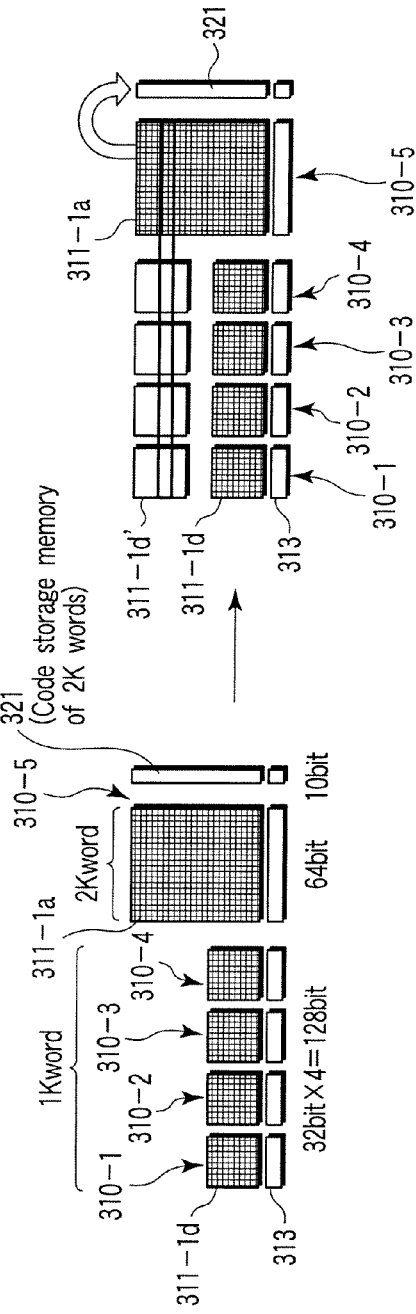
FIG. 11
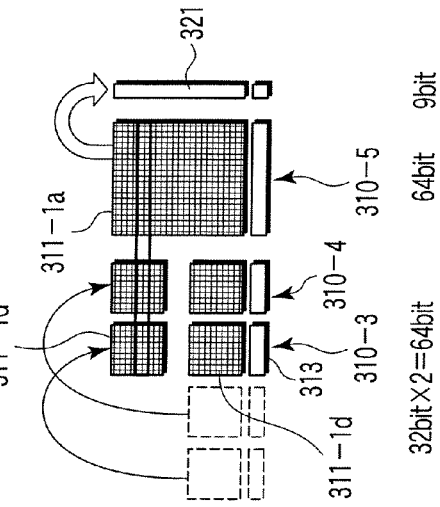
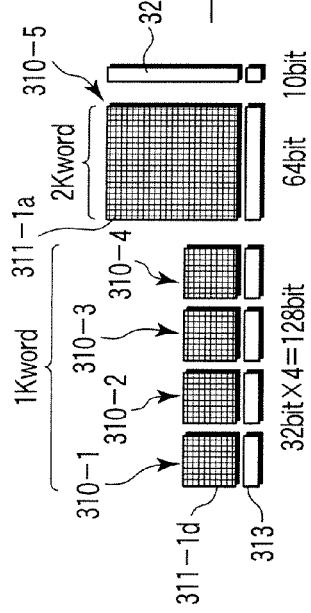
FIG. 12

Macro of 256b×1024:

Increase in flag bit: 128bit (12.5%)
Code storage memory: 12bit (1.2%)
Partial ECC code generating/decoding circuit (about 3%)
Other peripheral circuits (about 1%)

Total: + about 17.7%
(Prior art: 63% increase only by code storage memory)

Macros of 1kb×128, 4kb×64, 4kb×64, 128kb×4, 512kb×4:
Increase in flag bit: 11bit (2.8%)
Code storage memory: 11bit (2.0%)
Partial ECC code generating/decoding circuit (about 1%)
Other peripheral circuits (about 1%)

Total: + about 6.8%

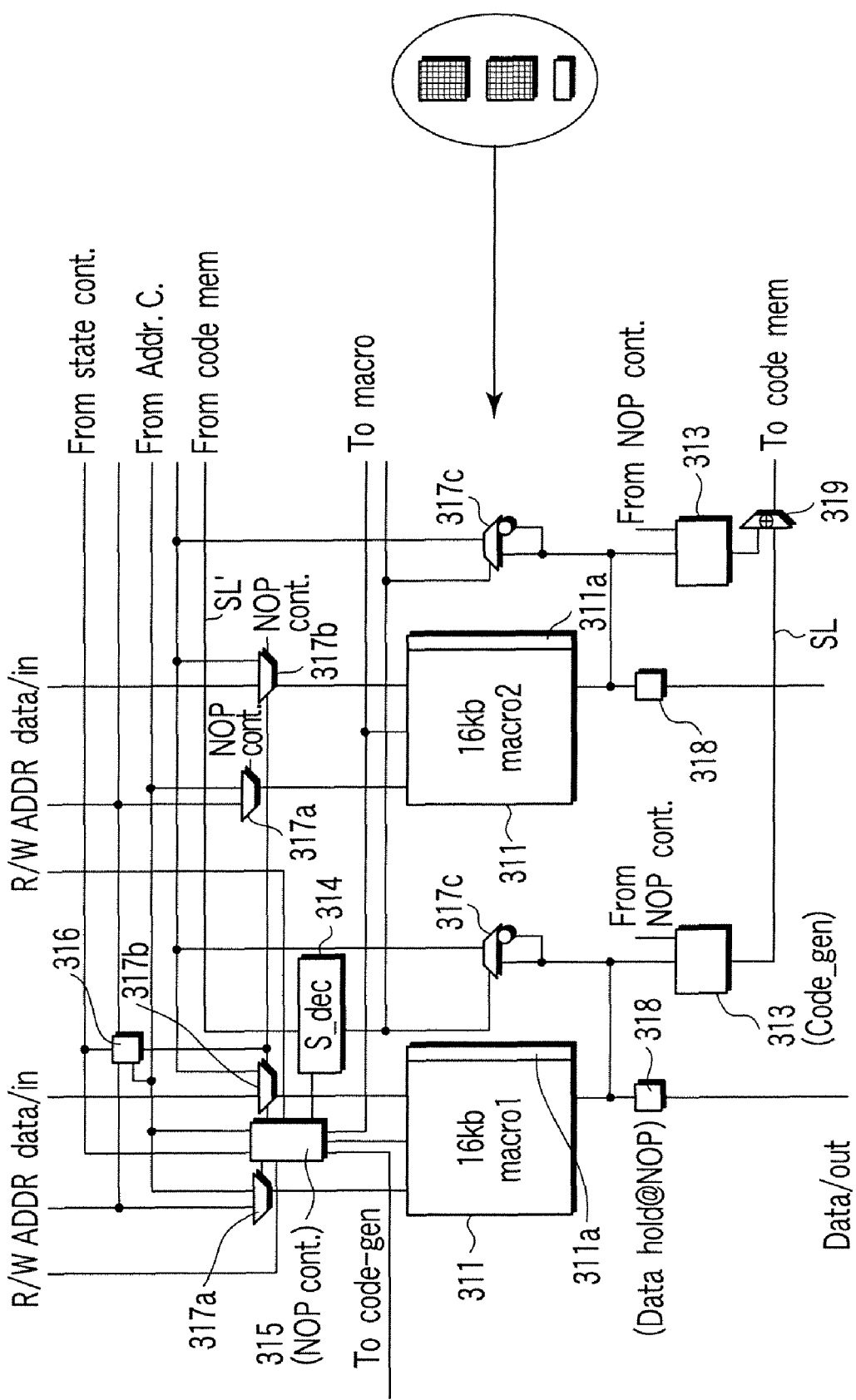
F I G. 22

| Macro1 | f1n | Macro2 | f2n | Macro3 | f3n | ... | Macro8 | f4n | |
|---|---|---|---|---|---|---|---|---|---|
| R | 1 | R | 1 | R | 1 | | R | 1 | → Code1_get 1 |
| NOP→Rn | 1 | R | 1 | R | 1 | | R | 1 | → Code2_get 1,2 |
| R | 1 | NOP→Rn | 1 | R | 1 | | R | 1 | → Code3_get 1,2,3 |
| R | 1 | R | 1 | Wn | 1 | | R | 1 | |
| ... | ... | ... | ... | ... | ... | | ... | ... | ... |
| NOP | 1 | R | 1 | (Wn) | 0 | | NOP→Rn | 1 | → Code8_get 1-8 |
| NOP | 1 | R | 1 | R | 0 | | R | 1 | → Code3_Rewritted |
| ... | | ... | | ... | | | ... | | |

311    311a

Completion of coding

F I G. 24

US 7,984,363 B2

INTEGRATED CIRCUIT DEVICE INCLUDING A CIRCUIT TO GENERATE ERROR CORRECTION CODE FOR CORRECTING ERROR BIT FOR EACH OF MEMORY CIRCUITS

CROSS-REFERENCE TO RELATED APPLICATIONS

This application is based upon and claims the benefit of priority from prior Japanese Patent Application No. 2006-268072, filed Sep. 29, 2006, the entire contents of which are incorporated herein by reference.

BACKGROUND OF THE INVENTION

1. Field of the Invention

The present invention relates to an integrated circuit device. More specifically, the invention relates to a semiconductor integrated circuit having an error checking and correcting (ECC) function within a single chip or on a single printed circuit board and an integrated circuit system having the same function.

2. Description of the Related Art

As the semiconductor circuit components (semiconductor chips) of a semiconductor integrated circuit have decreased in size, soft errors have recently been caused. It is considered that the soft errors are caused by alpha rays emitted from an isotope in a package and neutrons coming from space. In particular, data in a memory chip appears here and there and thus becomes a problem. In the near future, soft errors will increase with the decrease of electric capacity of a cell node due to the miniaturization of memory chips.

Conventionally an ECC circuit system is used as one measure using a circuit against soft errors. If the ECC circuit system is adopted, a package has to incorporate a peripheral circuit chip for ECC and an ECC code storing memory chip as well as a data storing memory chip. In a semiconductor integrated circuit having a small-capacity memory chip (small-sized memory), however, the area share of the small-sized memory, which is held by the ECC code storing memory chip, is large, as is the area share held by the peripheral circuit chip for ECC. The ECC circuit system is therefore a major factor in increasing the costs of the semiconductor integrated circuit.

On the other hand, a large-scale integrated circuit system such as a silicon-on-chip (SoC) can be implemented at the present time. For example, in a static random access memory (SRAM) including a plurality of small-capacity RAMs, the memory macro capacity (total bit number) of the RAMs is as enormous as several megabits (Mb). The area share of the large-scale integrated circuit system, which is held by a memory chip itself, is large. If a conventional ECC circuit system is applied to the large-scale integrated circuit system, the area of the ECC circuit system leads to the increase of the area of a mounting substrate (printed circuit board). In other words, there is a problem that the ECC circuit system becomes a factor in increasing the costs of the integrated circuit system.

As related art, there has been proposed a technique of preventing the increase of the area of a mounting substrate due to the equipment of an ECC function (see Jpn. Pat. Appln. KOKAI Publication No. 2001-249854, for example). This proposal however aims at reducing the overhead of a memory chip by distributing a fixed number of ECC bits to two or more memory units of the memory chip.

BRIEF SUMMARY OF THE INVENTION

According to a first aspect of the present invention, there is provided an integrated circuit device comprising a plurality of memory circuits which store data, a plurality of code generating circuits which are provided for the memory circuits, respectively, to generate an error correction code to correct an error bit of each data stored in the memory circuits, at least one code storage memory which is shared by the memory circuits to store code data obtained by the error correction code, at least one decoding circuit which is provided for each of the memory circuits to detect the error bit based on the code data stored in the code storage memory, at least one memory hibernation state control circuit to bring each of the memory circuits into a hibernation state in response to an external command, a state controller which controls the memory hibernation state control circuit and indicates an interrupt in a memory circuit in a hibernation state, and a plurality of correction circuits which are provided for the memory circuits, respectively, to correct the error bit detected by the decoding circuit by the interrupt in the memory circuit in the hibernation state in accordance with an indication of the state controller.

BRIEF DESCRIPTION OF THE SEVERAL VIEWS OF THE DRAWING

FIG. 4 is an illustration of an access method of the ECC memory circuit (generation of ECC code data) according to the first embodiment of the present invention;

FIG. 5 is an illustration of an access method of the ECC memory circuit (comparison/correction of ECC code data) according to the first embodiment of the present invention;

FIG. 8 is a diagram of an arrangement (address space) of the ECC memory circuit according to the first embodiment of the present invention, in order to describe the result obtained when the overhead of a memory chip is estimated;

FIG. 9 is a diagram of an arrangement (address space) of the ECC memory circuit in an integrated circuit device according to a second embodiment of the present invention;

FIG. 10 is a circuit diagram showing a configuration of an ECC memory circuit in an integrated circuit device according to a third embodiment of the present invention;

FIG. 11 is a diagram of an arrangement (address space) of the ECC memory circuit in the integrated circuit device according to the third embodiment of the present invention;

FIG. 12 is a diagram of another arrangement (address space) of the ECC memory circuit in the integrated circuit device according to the third embodiment of the present invention;

FIG. 22 is a circuit diagram showing an arrangement of an ECC memory circuit in the integrated circuit device shown in FIG. 21;

FIG. 24 is an illustration of an access method (comparison/correction processing of ECC code data) of an ECC memory circuit according to still another embodiment of the present invention.

DETAILED DESCRIPTION OF THE INVENTION

Embodiments of the present invention will be described with reference to the accompanying drawings. It should be noted that the drawings are schematic ones and the dimension ratios shown therein are different from the actual ones. The dimensions vary from drawing to drawing and so do the ratios of the dimensions. The following embodiments are directed to a device and a method for embodying the technical concept of the present invention and the technical concept does not specify the material, shape, structure or configuration of components of the present invention. Various changes and modifications can be made to the technical concept without departing from the spirit or scope of the claimed invention.

First Embodiment

Figure 1:
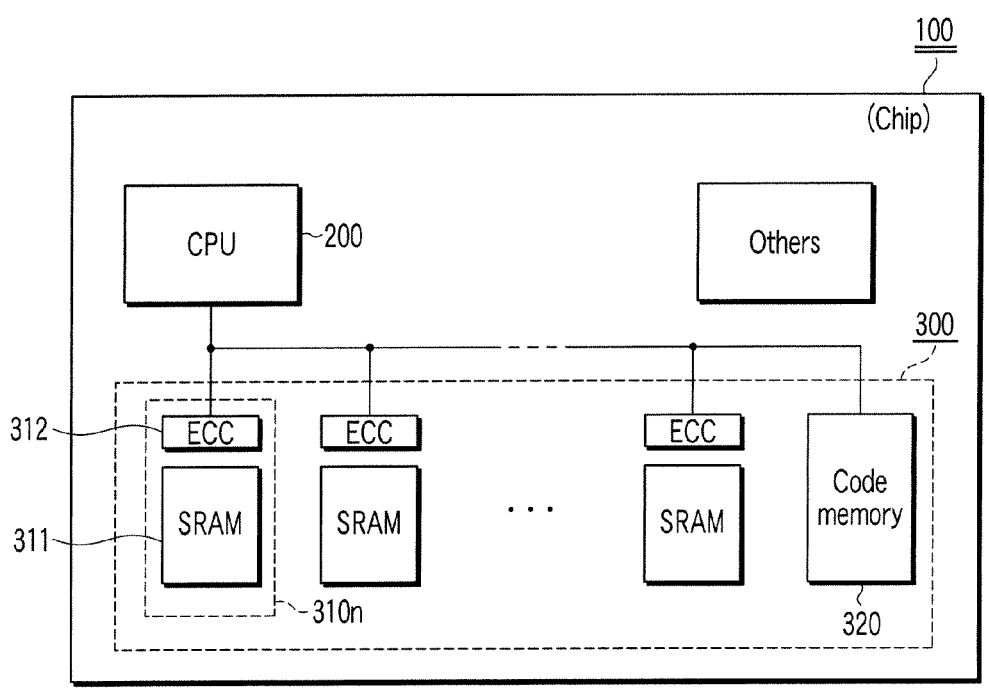
FIG. 1 is a block diagram showing a configuration of an integrated circuit device according to a first embodiment of the present invention.

FIG. 1 shows a basic configuration of an integrated circuit device according to a first embodiment of the present invention. The first embodiment will be described taking as an example a semiconductor integrated circuit in which a plurality of semiconductor circuit components (semiconductor chips) are integrated in one package (single chip). In the semiconductor integrated circuit, a partial code generating/decoding circuit (peripheral circuit) for ECC is provided for each small-capacity memory chip (memory macro). Bit errors in each memory macro can thus be corrected at once in data read operation. In the first embodiment, the size (capacity or memory configuration corresponding to the number of addresses=the number of words×bit width) of memory macros is the same.

Referring to FIG. 1, the semiconductor integrated circuit of the first embodiment includes a plurality of semiconductor circuit components, such as a central processing unit (CPU) 200 and an ECC memory circuit 300 including an ECC circuit system, which are integrated on a semiconductor substrate 100. The ECC memory circuit 300 includes, for example, a plurality of memory circuit units 310$n$ and one ECC code storage unit 320, for example. These units 310$n$ and 320 are connected to the CPU 200. The memory circuit units 310$n$ each include a data storing memory macro (e.g., SRAM macro) 311 and a partial ECC code generating/decoding circuit 312.

In the semiconductor integrated circuit, an ECC process is performed using a no operation (NOP) waiting operation which is a standby state of the memory macro 311. In other words, the memory macro 311 in its NOP waiting state can be interrupted appropriately to perform an ECC process for data stored in all memory macros 311.

Figure 2:
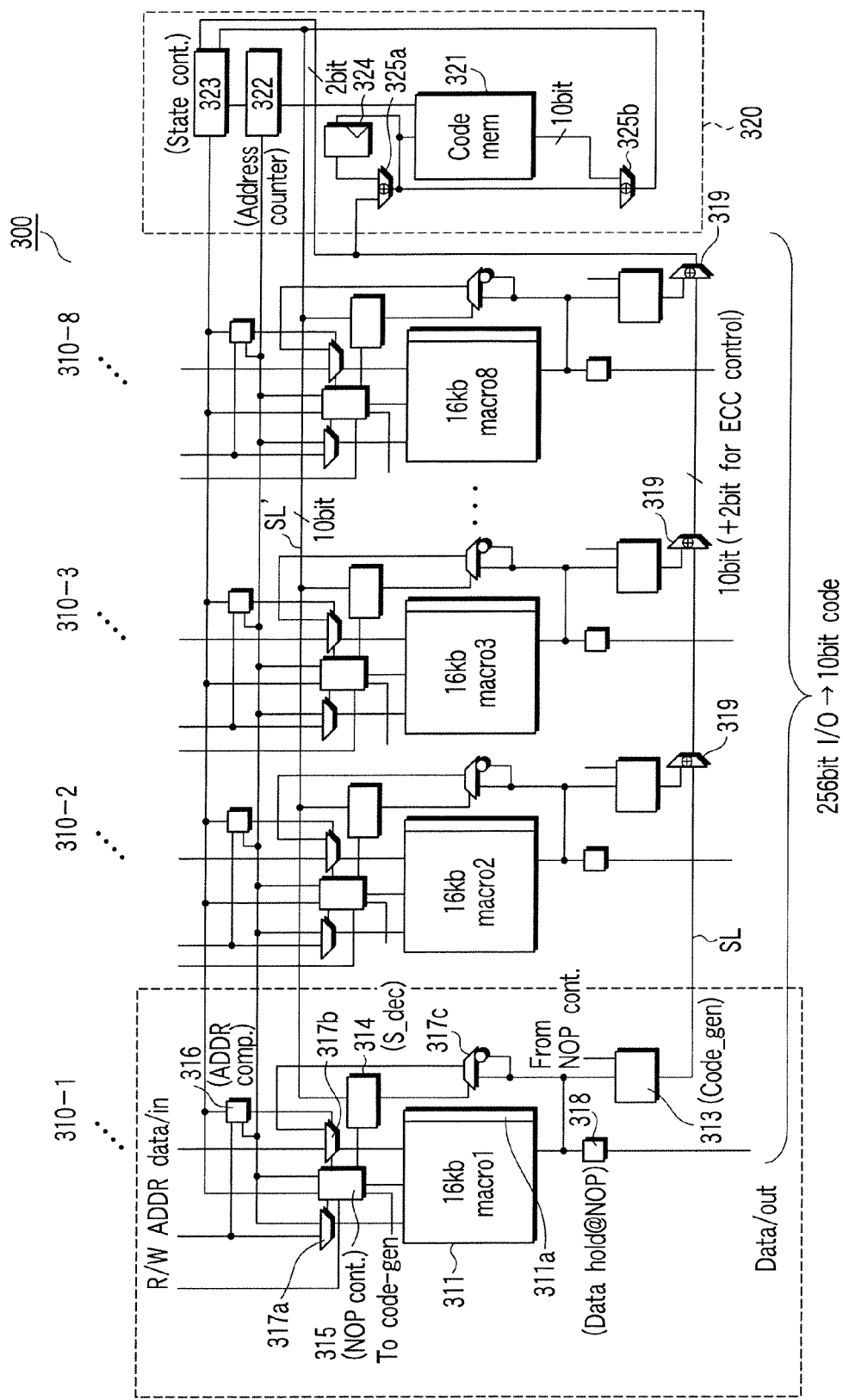
FIG. 2 is a circuit diagram showing an arrangement of an ECC memory circuit in the integrated circuit device according to the first embodiment of the present invention.

FIG. 2 shows a basic configuration of the above-described ECC memory circuit 300. In the first embodiment, the capacity of the memory macro 311 in each of the memory circuit units 310$n$ is set to 16 kilobits (kb) (=32 bits×512 words). There are eight memory circuit units 310$n$ (n=1 to 8) each including a memory macro 311 (32 bits×8=256 bits).

Referring to FIG. 2, the memory circuit units 310-1, 310-2, 310-3, . . . , 310-8 each include the partial ECC code generating/decoding circuit 312 around the memory macro 311. The partial ECC code generating/decoding circuit 312 includes a partial ECC code generating circuit (Code_gen) 313 and a partial ECC decoding circuit (syndrome decoder/S_dec) 314. As these control circuits, an NOP controller (NOP cont.) 315 which is a memory hibernation control circuit and an address comparator (ADDR comp.) 316 are provided. Multiplexers 317$a$, 317$b$ and 317$c$ each serving as a data selector and a flip-flop (Data Hold @NOP) 318 are arranged on the periphery of the memory macro 311.

The memory circuit units 310-2, 310-3, . . . , 310-8 other than the memory circuit unit 310-1 of the first stage each include an adder (exclusive-OR circuit) 319. The adder 319 XORs the output (error correction codes) of the partial ECC code generating circuit 313 (in no particular order), and generates 10-bit ECC code data (the final value of exclusive-OR) corresponding to all of 256-bit holding data (input data) as the final output. The adders 319 are connected to each other via a signal line (a bus between memories) SL having a bus width of 12 bits, for example. The signal line SL includes a signal line (+2 bit for ECC control) which has a bus width of 2 bits for a code generation end signal (1 bit) and flag information (Flag bit; 1 bit). In other words, 2 bits of the signal line SL having a bus width of 12 bits correspond to a signal line for the code generation end signal and the flag information.

The ECC code storage unit 320 includes an address counter 322, a state controller 323, a code register (buffer) 324, and adders 325$a$ and 325$b$ in addition to a code storage memory (Code mem) 321.

The memory macro 311 of each of the memory circuit units 310-1, 310-2, 310-3, . . . , 310-8 is a small-sized memory whose size (the number of words×bit width) is set to 16 kb, for example. In accordance with the bit width, small data (Data/In) produced by dividing input data (a series of data rows having a predetermined bit width, which is to be written) is stored (programmed). A flag storing bit 311$a$ of one bit, which is a flag storage unit, (or a flag storing cell of two or more bits) is added to each address of the memory macro 311. The flag storing bit 311a stores flag information to permit a write update history to be managed for each address. The flag information indicates whether data stored in the corresponding memory macro 311 is written. The flag information is transmitted to a state controller 323 from the signal line SL via each adder 319 from signal wire SL. The flag information serves as a control signal to instruct the partial ECC code generating circuit 313 to generate an error correction code when the memory macro 311 in its hibernation state is interrupted.

Each partial ECC code generating circuit 313 operates in response to a control signal from its corresponding NOP controller 315 in an NOP interrupt cycle (code generation mode or data comparison/correction mode). The circuit 313 also codes the holding data output from its corresponding memory macro 311 in accordance with the rule of the partial Hamming code determinant which is a procession element (the holding data corresponds to the above small data and is also called output data Data/Out). The circuit 313 therefore generates a partial ECC code (error correction code) corresponding to the holding data. In other words, the circuit 313 codes the holding data using a partial Hamming code determinant corresponding to the I/O (32-bit I/O in the first embodiment) of each memory macro 311, the partial Hamming code determinant being included in the long Hamming code determinant corresponding to all the I/Os (256-bit I/O in the first embodiment). The details of the partial Hamming code determinant will be described later. The generated partial ECC code is transmitted to the adder 325b and code register 324 from the signal line SL via the adders 319 and 325a.

The partial ECC code generating circuit 313 always outputs "0" except in data write operation and in NOP interrupt cycle. When the circuit 313 completes generating the partial ECC code, it outputs a code generation end signal. This code generation end signal is sent to the state controller 323 from the signal line SL via the adder 319. The code generation end signal is reset by a reset signal from the NOP controller 315 in the following step.

Each partial ECC decoding circuit 314 operates in response to a control signal from its corresponding NOP controller 315 in NOP interrupt cycle and decodes a syndrome signal in accordance with the rule of the partial Hamming code determinant. The syndrome signal is an output of the adder 325b and an exclusive-OR value of the outputs of the code storage memory 321 and the adder 325a. An error bit detection signal (memory correction bit), which is a decoding result, is transmitted to its corresponding multiplexer 317c as a correction circuit. The partial ECC decoding circuit 314 always outputs "0" except in NOP interrupt cycle.

Each multiplexer 317c includes a plurality of circuits (for 32 bits in the first embodiment) connected in parallel. The multiplexer 317c inverts or does not invert the holding data from the corresponding memory macro 311 bit by bit in response to the error bit detection signal from the corresponding partial ECC decoding circuit 314. Thus, the multiplexer 317c corrects only the error bit in the holding data (the multiplexer 317c inverts only the error bit in the holding data from the corresponding memory macro 311). The corrected data of the multiplexer 317c (inverting output and not-inverting output) is transmitted to the corresponding multiplexer 317b.

Each multiplexer 317b selects one of input data Data/In and the corrected data of the multiplexer 317c in response to one of a control signal from the corresponding NOP controller 315 and a control signal (data selector control signal) from the address comparator 316. The output of the multiplexer 317b is sent to the corresponding memory macro 311.

Each multiplexer 317a selects one of an internal address which is an output (count value) of the address counter 322 and an input address (external control address signal) ADDR, in response to a control signal from the corresponding NOP controller 315. The output of the multiplexer 317a is sent to the corresponding memory macro 311.

Each address comparator 316 generates a data selector control signal in accordance with the output of the address counter 322, the output of the state controller 323 and the input address ADDR, and outputs the signal to the multiplexer 317b which is a data selector. For example, in a data correction state (data comparison/correction mode), when the input address ADDR and the internal address (the count value of the address counter 322) coincide with each other, the address comparator 316 supplies the multiplexer 317b with a data selector control signal "0" for interrupting the correction operation. The address comparator 316 is therefore controlled to select the input data Data/In.

Each NOP controller 315 causes each component to perform a memory operation according to a mode (state). In response to a memory control signal (a read/write control signal R/W, a chip enable signal, a clock signal, etc.) output from the CPU 200 as an external command, an output of the address counter 322 and an output of the state controller 323, the NOP controller 315 generates the memory control signal, address selector control signal, data selector control signal, partial ECC code generation circuit control signal, and partial ECC decoding circuit control signal, and controls their respective memory macro 311, partial ECC code generating circuit 313, partial ECC decoding circuit 314 and multiplexer 317a and 317b. Immediately before a clock is input, the NOP controller 315 controls the respective components to perform a memory operation (reading, writing, etc.) in normal cycle except while an instruction issued from the CPU 200 is in NOP waiting state. In contrast, the NOP controller 315 controls the respective components to perform a memory operation in NOP interrupt cycle while the output of the state controller 323 indicates an NOP interrupt. Thus, the NOP controller 315 causes the components to perform a memory operation according to a state.

Each flip-flop 318 holds output data of its corresponding memory macro 311 temporarily when the output data is output from the ECC memory circuit 300 such as the CPU 200. The flip-flop 318 always holds data output in the preceding step.

In the ECC code storage unit 320, the code storage memory 321 stores all of the ECC codes corresponding to the bits of the memory macros and receives a value (10-bit ECC code data) obtained by adding the output of the code register 324 and the final output of the adder 319. This value is an output of the adder 325a.

The code register 324 holds the preceding output of the adder 325a in NOP interrupt cycle. The code register 324 is so configured that the AND value of output signals of each NOP controller 315 may be set to one of the input signals for register output control (not shown).

The adder 325a adds the output of the adder 319 of the memory circuit unit 310-8 of the final stage and the output of the code register 324 together to generate ECC code data that is stored in the above code storage memory 321. The output of the adder 319 is an additional value (final output) of partial ECC codes output from the partial ECC code generating circuit 313, and the additional value corresponds to the output data of each memory macro 311.

The adder 325b adds the output of the adder 325a and the output of the code storage memory 321 together to generate a syndrome signal. The generated syndrome signal is sent to each partial ECC decoding circuit 314 via a signal line SL'. The syndrome signal is sent to the state controller 323.

The state controller 323 controls the change of the state, etc. in response to a code generation end signal from each partial ECC code generating circuit 313, flag information stored in the flag storing bit 311a, and a syndrome signal from the adder 325b. For example, the state controller 323 outputs a control signal to each NOP controller 315 and each address comparator 316 and outputs a set/reset signal to the address counter 322.

The address counter 322 increments a count value (address) one by one in response to a set signal from the state controller 323 and supplies the count value to each NOP controller 315, each address comparator 316, each multiplexer 317a, and code storage memory 321. The count value of the address counter 322 is reset by the reset signal from the state controller 323.

Next, the above partial ECC code generating circuit 313 and partial ECC decoding circuit 314 will be described in more detail. Generally, an ECC code is generated by the code generating circuit that is regularized by the Hamming code determinant based on certain data.

Assume here that an ECC code is c, a Hamming procession is H, and data is U. The relationship among them is given by the following equation:

$$c = H \times U^T$$

where T is bit width.

Figure 3:
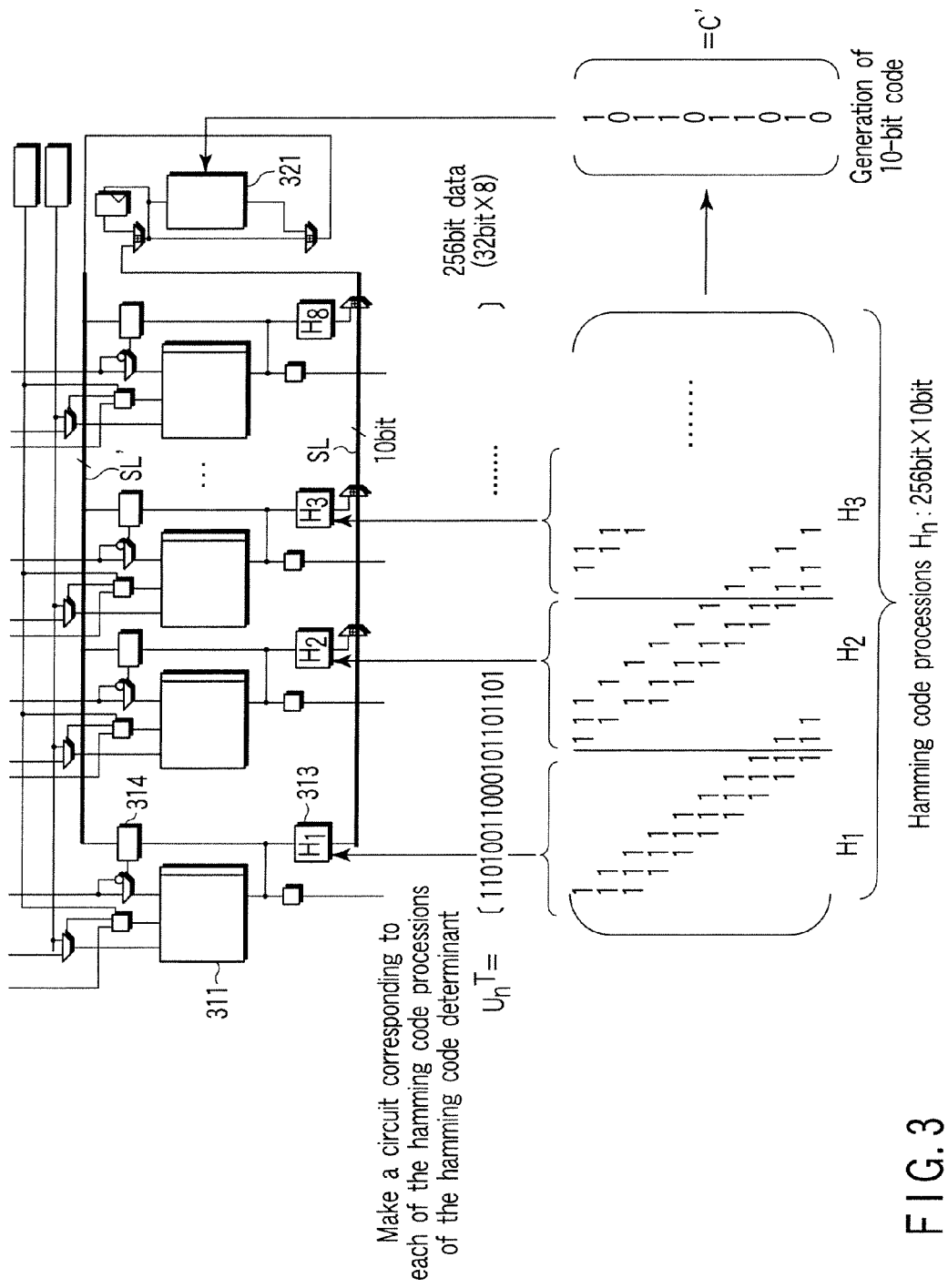
FIG. 3 is an illustration of the Hamming code determinant in the integrated circuit device according to the first embodiment of the present invention.

In the first embodiment, as shown in FIG. 3, 10-bit ECC code data is generated from input data (a series of data rows having a given bit width) whose total bit width is 256 bits (32 bits×8). If, therefore, the Hamming procession H is set to Hn (=$H_1, H_2, \ldots, H_8$) and output data U of each memory macro 311 is set to Un (=$d_1, d_2, \ldots, d_8$), the generated ECC code data c' is given by the following equation:

$$c' = Hn \times Un^T = H_1 \times d_1^T + H_2 \times d_2^T + \ldots + H_8 \times d_8^T.$$

That is, it is the partial ECC code generating circuit 313 that applies the Hamming procession Hn (=$H_1, H_2, \ldots, H_8$) as a rule (partial Hamming code determinant) for coding the output data of each memory macro 311.

In the first embodiment, the partial ECC code generating circuit 313 is configured in accordance with the bit width of each memory macro 311. However, the total area of the partial ECC code generating circuit 313 is almost the same as that of the code generating circuit of the prior art (conventional) ECC circuit system. Since a signal line SL that connects memory macros 311 only transfers coded 10-bit data, the number of wires (bus width) can largely be decreased. In other words, the number of wires, which was conventionally required to transfer 256-bit data that has not been, can be reduced to the number of wires for only 10 bits.

The same is true of not only the partial ECC code generating circuit 313 but also the partial ECC decoding circuit 314. In other words, the number of wires of the signal line SL' can largely be decreased by separating the decoding circuits in the prior art ECC circuit system in accordance with the bit width of each memory macro 311, as the partial ECC decoding circuit 314.

With the above configuration, even when the total bit width of a memory macro is increased to, for example, 512 bits or 1024 bits, the actual number of wires between memory macros is only at most 11 or 12 bits. An ECC circuit system can thus be implemented with a small bit width though it could not be done conventionally.

Next, a method of accessing an integrated circuit device with the above configuration will be described. In general, the control state of a memory circuit includes an NOP waiting state in which the memory circuit performs no operation but brings into a standby state as well as a memory operating state in normal cycle such as read/write cycle. The basic operation of the first embodiment is that the NOP waiting state is interrupted and replaced with an ECC process.

An ECC code generating process will be first described as an example of the above basic operation. Assume here that ECC code data is generated based on the hold data of address "n" of each memory macro 311.

First, each NOP controller 315 stands by until its corresponding memory macro 311 is brought into an NOP waiting state (NOP). Assume that a certain memory macro 311 is brought into the NOP waiting state under the direction of the CPU 200. Then, the corresponding NOP controller 315 controls the memory macro 311 according to the direction of the state controller 323 and the output of the address counter 322. When the direction of the state controller 323 is an NOP interrupt, the NOP controller 315 replaces the NOP waiting state with an NOP interrupt cycle to read hold data of address "n" from the memory macro 311 (NOP→RN). This hold data is coded (into a partial ECC code) through the corresponding partial ECC code generating circuit 313 and then sent to the code register 324 via the signal line SL and adders 319 and 325a. The memory macro 311 in which the NOP interrupt cycle has been performed returns to a standby (NOP waiting) state again until it receives the next direction. In this standby state, all the outputs of the partial ECC code generating circuit 313 are set to "0," and an unexpected partial ECC code is not transferred to the code register 324.

Similarly, the hold data of address "n" of all the memory macros 311 is read out in accordance with the direction from the state controller 323 and the output of the address counter 322, and then coded one by one. The coded data, i.e., the partial ECC codes are accumulated in sequence in the code register 324. Finally, the exclusive-OR values (ECC code data) of partial ECC codes are stored in the code register 324. If the NOP interrupt cycle is completed for all the memory macros 311 (the NOP waiting state is completed), the ECC code data accumulated in the code register 324 is written to address "n" of the code storage memory 321. Then, the ECC code generating process is completed, and the following step can be executed.

Adopting the above access method, the memory circuits can be operated completely independently of one another. It is therefore possible to inhibit a decrease in speed and a complicated control operation due to an interrupt cycle for ECC processing between normal cycles.

In each memory macro 311, writing of hold data (write operation W) and reading of hold data (read operation R) are carried out independently of each other. If the hold data of address "in" of the memory macro 311 is rewritten (written again) even partly after ECC code data is stored in the code storage memory 321, the ECC code data cannot be used. In other words, new ECC code data has to be generated.

In order to manage the generation of new ECC code data without contradiction when the hold data is rewritten, a flag storing bit 311a is prepared for each address of the memory macro 311. In the first embodiment, each time hold data is rewritten (Wn) in normal cycle, a flag storing bit 311a of corresponding address "n" is rewritten by flag information "0" (Wn "0") as shown in FIG. 5. Flag information "1" is written to the flag storing bit 311a before the code generating process is performed. The history of writing of hold data can easily be managed. In other words, the state controller 323 can easily recognize whether hold data has been rewritten only by checking (comparing) the flag storing bits 311a of the memory macros 311.

Figure 6:
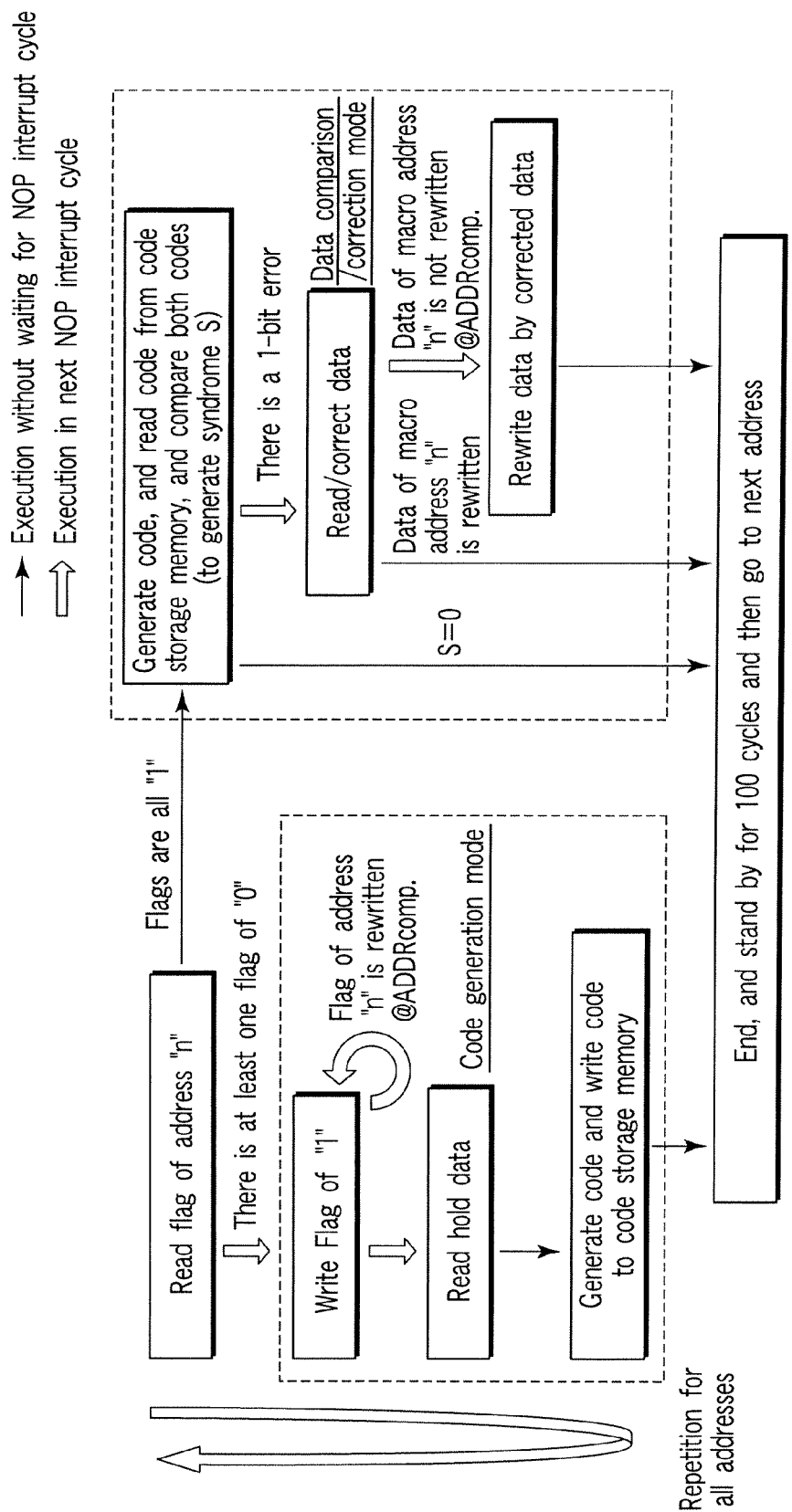
FIG. 6 is a flowchart showing a process in an ECC processing sequence according to the first embodiment of the present invention.

FIG. 6 is a flowchart showing an ECC processing sequence in the above semiconductor integrated circuit according to the first embodiment of the present invention. In the first embodiment, a cycle in which the memory macros 311 are accessed one by one to generate ECC code data, etc. is defined as one state. In this flowchart, the state controller 323 determines each state, controls the address counter 322, etc.

First, at the beginning of the sequence, the state controller 323 controls the NOP controller 315 in accordance with the output of the address counter 322 to read the flag information of the flag storing bit 311a of address "n" of each memory macro 311. The state controller checks whether all flag information are "1." If at least one of the flag information is "0," the mode is shifted to a code generation mode. If all of the flag information is "1," the mode is shifted to a data comparison/correction mode (data correction state).

In the code generation mode, the state controller 323 controls each NOP controller 315 to write flag information "1" to all flag storing bits 311a of address "n" corresponding to the output of the address counter 322. In the next NOP interrupt cycle, the hold data of address "n" of a certain memory macro 311 is read out under the control of the state controller 323. If the hold data has already been rewritten and the flag information of the corresponding flag storing bit 311a is "0," flag information "1" is written again.

When all the flag information are "1," the hold data read out of address "n" of each memory macro 311 is sent to the corresponding partial ECC code generating circuit 313. Under the control of the NOP controller 315, the circuit 313 generates a partial ECC code in accordance with the rule of the partial Hamming code determinant. The partial ECC codes generated by the circuit 313 are multiplexed via a signal line SL and adders 319 and 325a, and then sent to the code register 324 one by one.

ECC code data corresponding to the hold data of all addresses "n" is stored in the code register 324. This is determined in the state controller 323 in response to a code generation end signal from each partial ECC code generation circuit 313. The ECC code data stored in the code register 324 is written to address "n" of the code storage memory 321, thus completing the code generation mode.

In the data comparison/correction mode, each partial ECC code generating circuit 313 generates a partial ECC code as in the case where all the flag information is "1." More specifically, when the state controller 323 determines that flag information "1" is written to all the flag storing bits 311a of address "n" corresponding to the output of the address counter 322, each NOP controller 315 reads the hold data of address "n." The hold data is sent to the corresponding partial ECC code generating circuit 313. Under the control of the NOP controller 315, the circuit 313 generates a partial ECC code. The partial ECC code is sent to the code register 324 via the signal line SL and adders 319 and 325a. ECC code data corresponding to all the hold data is stored in the code register 324. The ECC code data is provided for generating a subsequent syndrome signal.

Under the control of the state controller 323, ECC code data corresponding to the output (address "n") of the address counter 322 is read out of the code storage memory 321. The ECC code is compared with (added to) the ECC code data, which is stored in the code register 324 and supplied via the adder 325a, by the adder 325b and brought into a syndrome signal. Then, the state controller 323 checks the syndrome signal. If the syndrome signal has no problem, the data comparison/correction mode is completed as it is (S=0).

If the syndrome signal has a problem, hold data is read out of a memory macro 311 again in the following NOP interrupt cycle. If there is a conflicting bit between the ECC code data read out of the code storage memory 321 and the ECC code data stored in the code register 324, it is detected as an error bit. When the error bit is detected, the state controller 323 controls the NOP controller 315 to read hold data including the error bit from address "n" of the corresponding memory macro 311. This hold data is sent to its corresponding multiplexer 317c. The multiplexer 317c is controlled by its corresponding partial ECC decoding circuit 314 in response to the above syndrome signal.

Each partial ECC decoding circuit 314 decodes the above syndrome signal in accordance with the rule of the partial Hamming code determinant under the control of the corresponding NOP controller 315. Accordingly, an error bit detection signal is generated. The error bit detection signal is transmitted to its corresponding multiplexer 317c. Then, only the bit in the hold data corresponding to the error bit is inverted, and it is sent to the multiplexer 317b. All of the hold data stored in the memory macro 311 can thus be subjected to ECC processing at once.

Under the above conditions, the state controller 323 controls the address comparator corresponding to the internal address from the input address ADDR or the internal address from the address counter 322. This address comparator 316 controls its corresponding multiplexer 317b. The multiplexer 317b is controlled by its corresponding NOP controller 315. The multiplexer 317a supplied with an input address ADDR and an internal address from the address counter 322, is controlled by the corresponding NOP controller 315. The corrected data from the multiplexer 317c is sent to the corresponding memory macro 311 and written to the address corresponding to the internal address. In other words, the corrected data is rewritten. By doing so, the data comparison/correction mode is completed.

At the time of write operation in normal cycle, the NOP controller 315 is controlled in response to a read/write control signal R/W, and the multiplexer 317b is controlled by its corresponding NOP controller 315 and address comparator 316. The multiplexer 317a is controlled by its corresponding NOP controller 315. Thus, the multiplexer 317b selects input data Data/In. The selected input data Data/In is transmitted to its corresponding memory macro 311 and written to an address corresponding to the above input address ADDR.

Similarly, in data comparison/correction mode, when input address ADDR and an internal address coincide with each other after the comparison of the address comparator 316, data selector control signal "0" for interrupting a correction operation is output to the multiplexer 317b, and input data Data/In is selected. In other words, when it is determined that the hold data of the input address ADDR has already been rewritten in accordance with the input address ADDR, the correction operation is interrupted, and the data comparison/correction mode is completed.

When the code generation mode and data comparison/correction mode are mostly completed, the state controller 323 operates the address counter 322 to repeat the same ECC processing sequence by the next address. This sequence is cyclically performed for all of the addresses, with the result that soft errors can be checked periodically.

Figure 7:
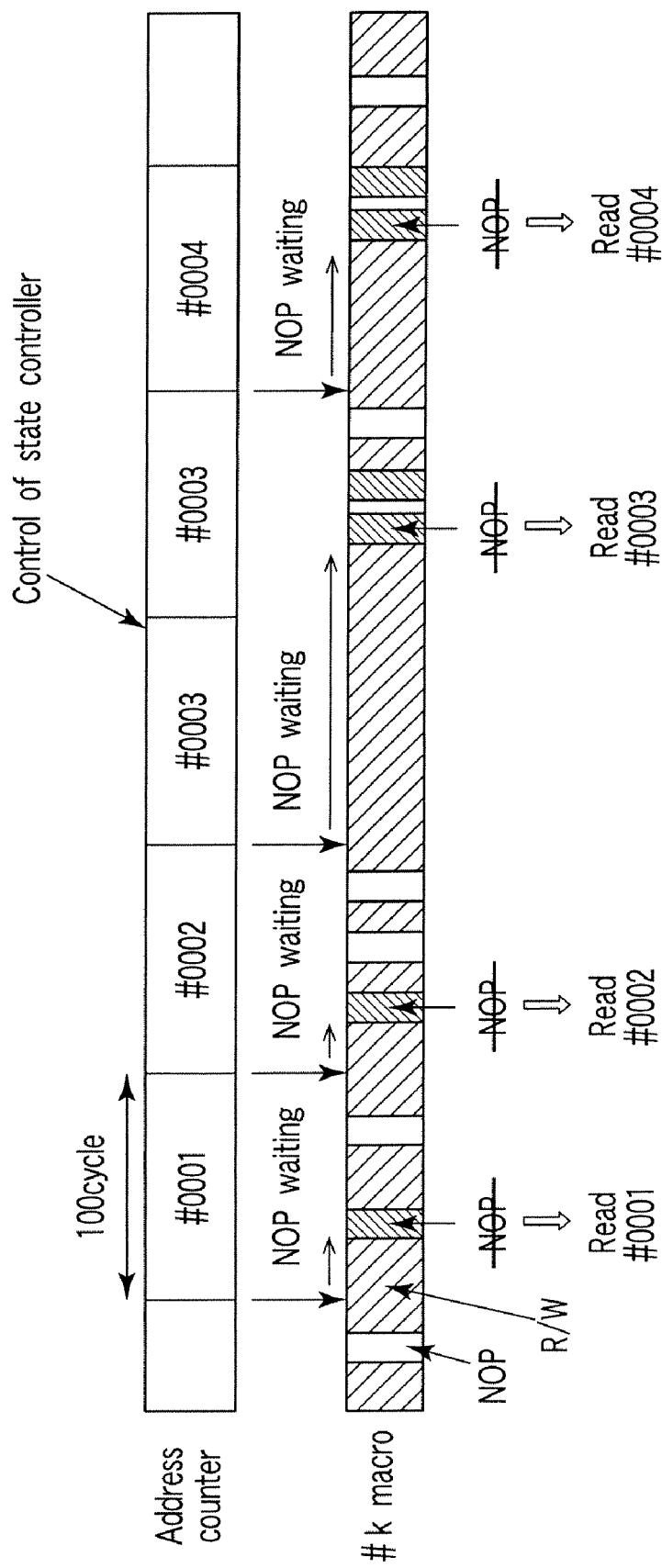
FIG. 7 is an illustration of advantages brought about by the ECC processing sequence according to the first embodiment of the present invention.

Assume that the ECC processing sequence for one address is performed once every 100 cycles as shown in FIG. 7. Since the NOP waiting state of one to several cycles becomes only active, the increase in power is only several percent at most, as compared with that in active operation (normal cycle). When a 100 MHz operation is carried out for eight memory macros 311 of 32 words×32 bits, the ECC processing sequence is executed for each address with the frequency of thirty times per second. This ECC processing sequence is converted into the soft error rate (SER). If the SER is equal to $2\times10^{-5}$ err/h/Mb (Qcrit=2 fC), check can be performed $5.1\times10^9$ times. This is an about 9-digit improvement as compared with the case where no ECC circuit system is mounted, which is adequately advantageous to the improvement of SER.

FIG. 8 shows a result (address space) obtained when the overhead of the area of a memory chip is estimated in the above-mentioned configuration. According to the first embodiment, the increase in area can be reduced to about 11.0% on the whole as compared with the case where no ECC circuit system is mounted. Using a conventional ECC circuit system, only the code storage memory increases the area about 22%.

As described above, a partial ECC code generating/decoding circuit is provided for each memory macro, and all of the hold data stored in each memory macro can be corrected at once. More specifically, a code generating circuit and a decoding circuit for ECC are separated from each other according to the bit width of each memory macro, while a code storage memory which stores code data is shared with the code generating circuit and a decoding circuit. ECC processing is performed using an interrupt in the NOP waiting state of a memory macro. The number of wires (wiring regions) can thus be reduced greatly without increasing the total area of the code generating circuit and the decoding circuit. ECC processing can be performed at once without almost affecting any normal storage operation of a memory macro. The increase in chip area due to the mounting of an ECC circuit system can be suppressed more greatly than that in the prior art.

In particular, a plurality of memory macros can be controlled individually. Even though the same address of all the memory macros is accessed in code generation mode and data comparison/correction mode, the drawback that access limitations to a user are very complicated can be avoided, and the flexibility of memory access can be improved significantly.

Second Embodiment

FIG. 9 shows an arrangement (address space) of an ECC memory circuit in an integrated circuit device according to a second embodiment of the present invention. The second embodiment is directed to the semiconductor integrated circuit of the first embodiment which is so configured that data stored in a plurality of memory macros whose sizes are different (but whose word widths are the same) can be corrected at once. The same components as those of the first embodiment are denoted by the same reference numerals and their detailed descriptions are omitted.

In the second embodiment, as shown in FIG. 9, eighteen memory circuit units 310 in all are prepared for an ECC memory circuit 300a. Of the eighteen memory circuit units 310, eight memory circuit units 310 each have a memory macro $311_{-1a}$ whose capacity (memory structure) is 128 kb (32 bits×4 Kword). Other eight memory circuit units 310 each have a memory macro $311_{-1b}$ whose capacity (memory structure) is 256 kb (64 bits×4 Kword). The other two memory circuit units 310 each have a memory macro $311_{-1c}$ whose capacity is 512 kb (128 bits×4 Kword). On the other hand, a code storage memory 321 can store 12-bit ECC code data corresponding to 1024-bit (32 bits×8+64 bits×8+128 bits×2) hold data. The code storage memory 321 also has a capacity of 4 Kword which is adaptable to the 4-Kword hold data having the greatest word width.

In the above configuration, each memory circuit unit 310 generates a partial ECC code corresponding to the hold data of all the words of memory macros 311-1a, 311-1b and 311-1c by the access method (the code generation mode and the data comparison/correction mode) as described in the first embodiment.

As in the first embodiment, since ECC processing is performed using an interrupt in the NOP waiting state of a memory macro, it can be done at once without almost affecting any normal storage operation of a memory macro. Further, the number of wires (wiring regions) can be reduced greatly without increasing the total area of a code generating circuit and a decoding circuit. The increase in chip area due to the mounting of an ECC circuit system can be suppressed more greatly than that in the prior art.

More specifically, in the above configuration, when the overhead of the area of the chip is estimated, the increase in the area can be suppressed about 5.0% on the whole as compared with the case where no ECC circuit system is mounted.

Third Embodiment

FIG. 10 shows a basic arrangement of an ECC memory circuit in an integrated circuit device according to a third embodiment of the present invention. The third embodiment is directed to the semiconductor integrated circuit of the first embodiment which is so configured that data stored in memory macros whose sizes are different or whose word widths are the same can be corrected at once. The same components as those of the first embodiment are denoted by the same reference numerals and their detailed descriptions are omitted.

In the third embodiment, as shown in FIG. 10, five memory circuit units $310_{-1}$, $310_{-2}$, $310_{-3}$, $310_{-4}$ and $310_{-5}$ in all are prepared for an ECC memory circuit 300b. Of these five memory circuit units, four memory circuit units $310_{-1}$, $310_{-2}$, $310_{-3}$ and $310_{-4}$ each have a memory macro $311_{-1d}$ whose capacity (memory structure) is 32 kb (32 bits×1K words). In contrast, the memory circuit unit $310_{-5}$ each have a memory macro $311_{-1a}$ whose capacity (memory structure) is 128 kb (64 bits×2K words). On the other hand, a code storage memory 321 can store 10-bit ECC code data corresponding to hold data of 192 bits (32 bits×4+64 bits×1). The code storage memory 321 also has a capacity of 2K words, which is adaptable to 2K-word hold data having the greatest word width.

In the memory circuit unit $310_{-5}$, a partial ECC code corresponding to the hold data of the 0th to 2047th words of the memory macro $311_{-1a}$ is generated by the access method (the code generation mode and the data comparison/correction mode) as described in the first embodiment. Similarly, in the memory circuit units $310_{-1}$, $310_{-2}$, $310_{-3}$ and $310_{-4}$, a partial ECC code corresponding to the hold data of the 0th to 1023rd words of the memory macro $311_{-1d}$ is generated by the access method as described in the first embodiment. In the memory circuit units $310_{-1}$, $310_{-2}$, $310_{-3}$ and $310_{-4}$, however, when a partial ECC code corresponding to the hold data of the 1024th to 2047th words of the memory macro $311_{-1d}$ is generated, or when an address of 1K word or more (virtual memory space $311_{-1d'}$) is specified, its corresponding NOP controller 315 controls the output of a partial ECC code generating circuit 313 such that all bits are set to "0" as shown in FIG. 11. Thus, the memory macro $311_{-1d}$ of 1K word can be regarded as a memory macro of 2K word by writing hold data "0" to all of the 1024th to 2047th words.

When the memory macros $311_{-1a}$ and $311_{-1d}$ differ in word width, partial ECC codes of the larger word width are generated (2K word of the memory macro $311_{-1a}$ in this case). Then, "0" is written as ECC code data to an address of the code storage memory 321 that corresponds to virtual memory space $311_{-1d'}$ that does not actually exist. ECC code data can thus be generated even though the memory macros $311_{-1a}$ and $311_{-1d}$ differ in word width.

In the partial ECC decoding circuit 314, too, each 1K-word memory macro $311_{-1d}$ is regarded as a 2K-word memory having virtual memory space $311_{-1d'}$ for 1K word by the output of the NOP controller 315 (In the virtual memory space $311_{-1d'}$, however, no ECC processing is performed since no soft errors occur).

As described above, even when memory macros $311_{-1a}$ and $311_{-1d}$ with different word widths are mounted, ECC processing can be performed at once for all the hold data stored in each of the memory macros $311_{-1a}$ and $311_{-1d}$, without increasing the chip area or almost affecting the memory operation in normal cycle.

In the third embodiment (see FIG. 11), as shown in FIG. 12, two of four 1K-word memory macros $311_{-1d}$ are stacked one on another in the address direction (vertically arranged), and the virtual memory space ($311$-$1d'$) can be eliminated in substance. This example is equal to the configuration in which each of the memory circuit units 310-3 and 310-4 includes two 1K-word memory macros $311_{-1d}$, as shown in FIG. 12. Thus, the word width of the 1K-word memory macro $311_{-1d}$ can also be caused to virtually coincide with that of the 2K-word memory macro $311_{-1a}$. With this configuration, the multiplexer 317a switches two memory macros $311_{-1d}$ arranged vertically between access to the hold data of each of the 0th to 1023rd words and access to the hold data of the 1024th to 2047th words. Thus, the two memory macros $311_{-1d}$ arranged vertically can be controlled independent of each other.

In addition to the above advantage, when the virtual memory space ($311_{-1d'}$) is provided, a redundant memory area is not required in the code storage memory 321, and the bit width of ECC code data can be reduced to 9 bits from 10 bits.

In particular, when each partial ECC code generating circuit 313 of the memory macros $311_{-1d}$ having the same memory structure generates a partial ECC code in accordance with the rule corresponding to the same procession elements, the number of partial ECC code generating circuits 313, which are required for each 1K-word memory macro $311_{-1d}$, can be reduced (the number is reduced from four to two in this example), and the chip area can be decreased.

As the memory macros arranged vertically in address space, sixty-four 1K-word memory macros can be arranged if 1K-word and 64K-word memory macros are mounted together in accordance with the greater word width of one of the 1K-word and 64K-word memory macros.

Fourth Embodiment

Figure 13:
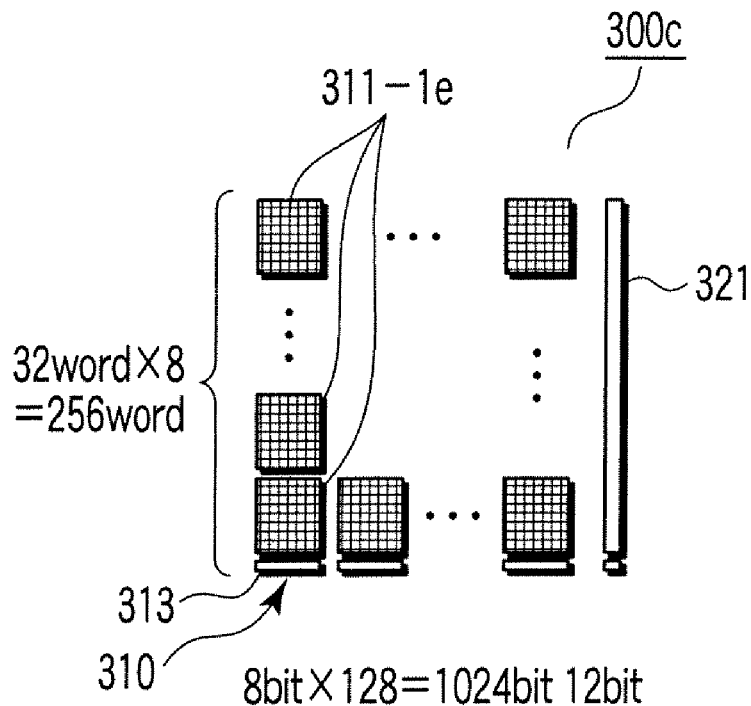
FIG. 13 is a diagram of an arrangement (address space) of an ECC memory circuit in an integrated circuit device according to a fourth embodiment of the present invention.

FIG. 13 shows an arrangement (address space) of an ECC memory circuit in an integrated circuit device according to a fourth embodiment of the present invention. The fourth embodiment is directed to the semiconductor integrated circuit of the first embodiment which is so configured that data stored in memory macros of the same size can be corrected at once. The same components as those of the first embodiment are denoted by the same reference numerals and their detailed descriptions are omitted.

In the fourth embodiment, as shown in FIG. 13, a plurality of memory circuit units 310 (128 memory circuit units 310 in this embodiment) are prepared for an ECC memory circuit 300c. The memory circuit units 310 each have a plurality of (eight in this embodiment) memory macros $311_{-1e}$ whose capacity (memory structure) is 256 bits (8 bits×32 words). The eight memory macros $311_{-1e}$ are arranged vertically in address space. With this arrangement, a multiplexer 317a switches the eight memory macros $311_{-1e}$ alternatively when gaining access thereto. Thus, these eight memory macros $311_{-1e}$ can be controlled independently of one another. On the other hand, a code storage memory 321 can store 12-bit ECC code data corresponding to 1024-bit (8 bits×128) hold data. The code storage memory 321 also has a capacity of 256 words, which is adaptable to 256-word hold data having the greatest word width.

As in the first embodiment, since ECC processing is performed using an interrupt in the NOP waiting state of a memory macro, it can be done at once without almost affecting any normal storage operation of a memory macro. Further, the number of wires (wiring regions) can be reduced greatly without increasing the total area of a code generating circuit and a decoding circuit. The increase in chip area due to the mounting of an ECC circuit system can be suppressed more greatly than that in the prior art.

More specifically, in the above configuration, when the overhead of the area of the chip is estimated, the increase in the area can be suppressed about 17.7% on the whole as compared with the case where no ECC circuit system is mounted. In the prior art ECC circuit system, the area is increased about 63% only by the code storage memory.

Fifth Embodiment

Figure 14:
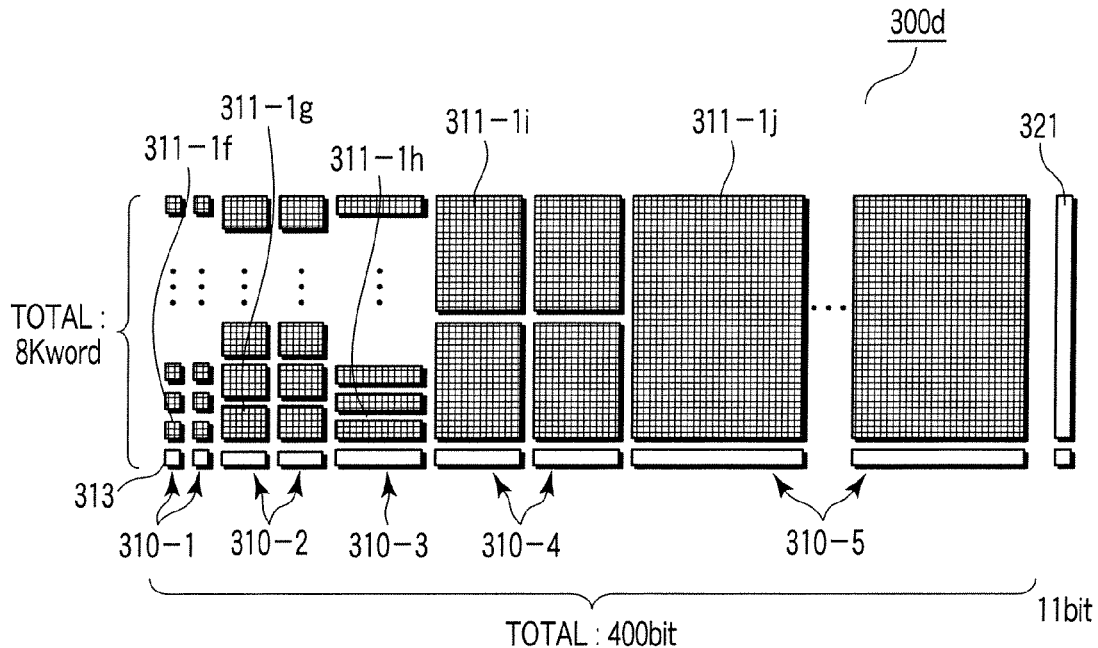
FIG. 14 is a diagram of an arrangement (address space) of an ECC memory circuit in an integrated circuit device according to a fifth embodiment of the present invention.

FIG. 14 shows an arrangement (address space) of an ECC memory circuit in an integrated circuit device according to a fifth embodiment of the present invention. The fifth embodiment is directed to the semiconductor integrated circuit of the first embodiment which is so configured that data stored in memory macros of different sizes can be corrected at once. The same components as those of the first embodiment are denoted by the same reference numerals and their detailed descriptions are omitted.

In the fifth embodiment, as shown in FIG. 14, eleven memory circuit units $310_{-1}, 310_{-2}, 310_{-3}, 310_{-4}$ and $310_{-5}$ in all are prepared for an ECC memory circuit 300d. Of these eleven memory circuit units, two memory circuit units $310_{-1}$ each have a plurality of memory macros $311_{-1f}$ (64 memory macros for 8K words) whose capacity (memory structure) is 1 kb (8 bits×8K/64 words). The memory macros $311_{-1f}$ are arranged vertically in address space. The two memory circuit units $310_{-2}$ each have a plurality of memory macros $311_{-1g}$ (32 memory macros for 8K words) whose capacity (memory structure) is 4 kb (16 bits×8K/64 words). The memory macros $311_{-1g}$ are arranged vertically in address space. The memory circuit unit $310_{-3}$ has a plurality of memory macros $311_{-1h}$ (64 memory macros for 8K words) whose capacity (memory structure) is 4 kb (32 bits×8K/64 words). The memory macros $311_{-1h}$ are arranged vertically in address space. The two memory circuit units $310_{-4}$ each have a plurality of memory macros $311_{-1i}$ (2 memory macros for 8K words) whose capacity (memory structure) is 128 kb (32 bits×8K/64 words). The memory macros $311_{-1i}$ are arranged vertically in address space. The other four memory circuit units $310_{-5}$ each have a memory macro $311_{-1j}$ whose capacity (memory structure) is 512 kb (64 bits×8K/64 words). On the other hand, a code storage memory 321 can store 11-bit ECC code data corresponding to hold data of 400 bits ((1 kb×128+4 kb×64+4 kb×64+128 kb×4+512 kb×4)/8K words). The code storage memory 321 also has a capacity of 8K words, which is adaptable to 8K-word hold data having the greatest word width.

In the memory circuit units $310_{-1}$, $310_{-2}$, $310_{-3}$ and $310_{-4}$ described above, a multiplexer 317a switches the memory macros $311_{-1f}$, $311_{-1g}$, $311_{-1h}$ and $311_{-1i}$ alternatively when gaining access thereto. These memory macros can thus be controlled independently of one another. The partial ECC codes corresponding to the hold data of all the words of the memory macros $311_{-1f}$, $311_{-1g}$, $311_{-1h}$, $311_{-1i}$ and $311_{-1j}$ are generated by the access method (code generation mode and data comparison/correction mode) as described in the first embodiment.

As in the first embodiment, since ECC processing is performed using an interrupt in the NOP waiting state of a memory macro, it can be done at once without almost affecting any normal storage operation of a memory macro. Further, the number of wires (wiring regions) can be reduced greatly without increasing the total area of a code generating circuit and a decoding circuit. The increase in chip area due to the mounting of an ECC circuit system can be suppressed more greatly than that in the prior art.

More specifically, in the above configuration, when the overhead of the area of the chip is estimated, the increase in the area can be suppressed about 6.8% on the whole as compared with the case where no ECC circuit system is mounted.

Figures 15A, 15B:
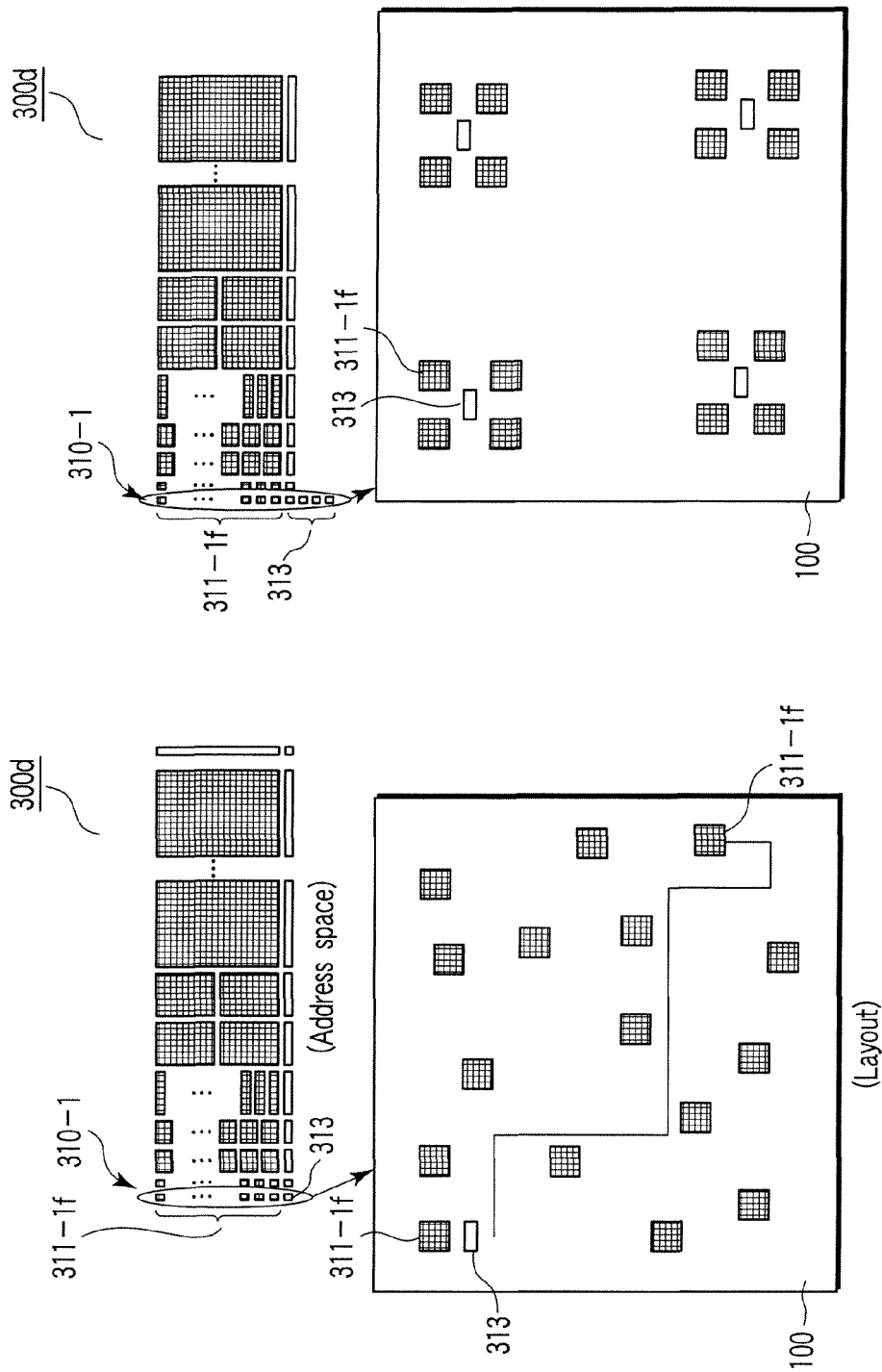
FIGS. 15A and 15B are diagrams of an arrangement (address space) of the ECC memory circuit in the integrated circuit device according to the fifth embodiment of the present invention.

FIGS. 15A and 15B are diagrams showing a number of memory macros which are scattered on a package and can be arranged vertically in address space in the integrated circuit device according to the fifth embodiment of the present invention. As compared to the third embodiment shown in FIG. 12, for example, a pair of partial ECC code generating circuits 313 has only to be provided for sixty-four memory macros $311_{-1f}$ (FIGS. 15A and 15B show only sixteen memory macros for the sake of convenience). The memory macros $311_{-1f}$ are not always arranged adjacent to each other on the actual package. If, therefore, the partial ECC code generating circuits 313 and the memory macros $311_{-1f}$ are largely separated from each other, there is possibility that cycle time will be lengthened by wiring delay (see FIG. 15A).

When a number of memory macros $311_{-1f}$ of the same size, which can be arranged vertically in address space, are scattered on a package, a plurality of pairs (four pairs in this case) of partial ECC code generating circuits 313 (which are shared by sixty-four memory macros $311_{-1f}$). Then, each of the partial ECC code generation circuits 313 is shared by sixteen memory macros $311_{-1f}$ (four memory macros in FIG. 15B for the sake of convenience) which can be arranged close to each other to form a colony. Wiring delay can thus be lessened (see FIG. 15B). Even though a plurality of pairs of partial ECC code generating circuits 313 are prepared, the number of words to be accessed actually is one, and only one is selected from the sixty-four memory macros $311_{-1f}$. Accordingly, there is no conflict between partial ECC codes to be generated.

Any special method need not be used to connect the memory macros, but the same method as that for a partial ECC code generating circuit for another memory macro can be used. The same is true of a memory macro other than the memory macros $311_{-1f}$.

Sixth Embodiment

Figure 16:
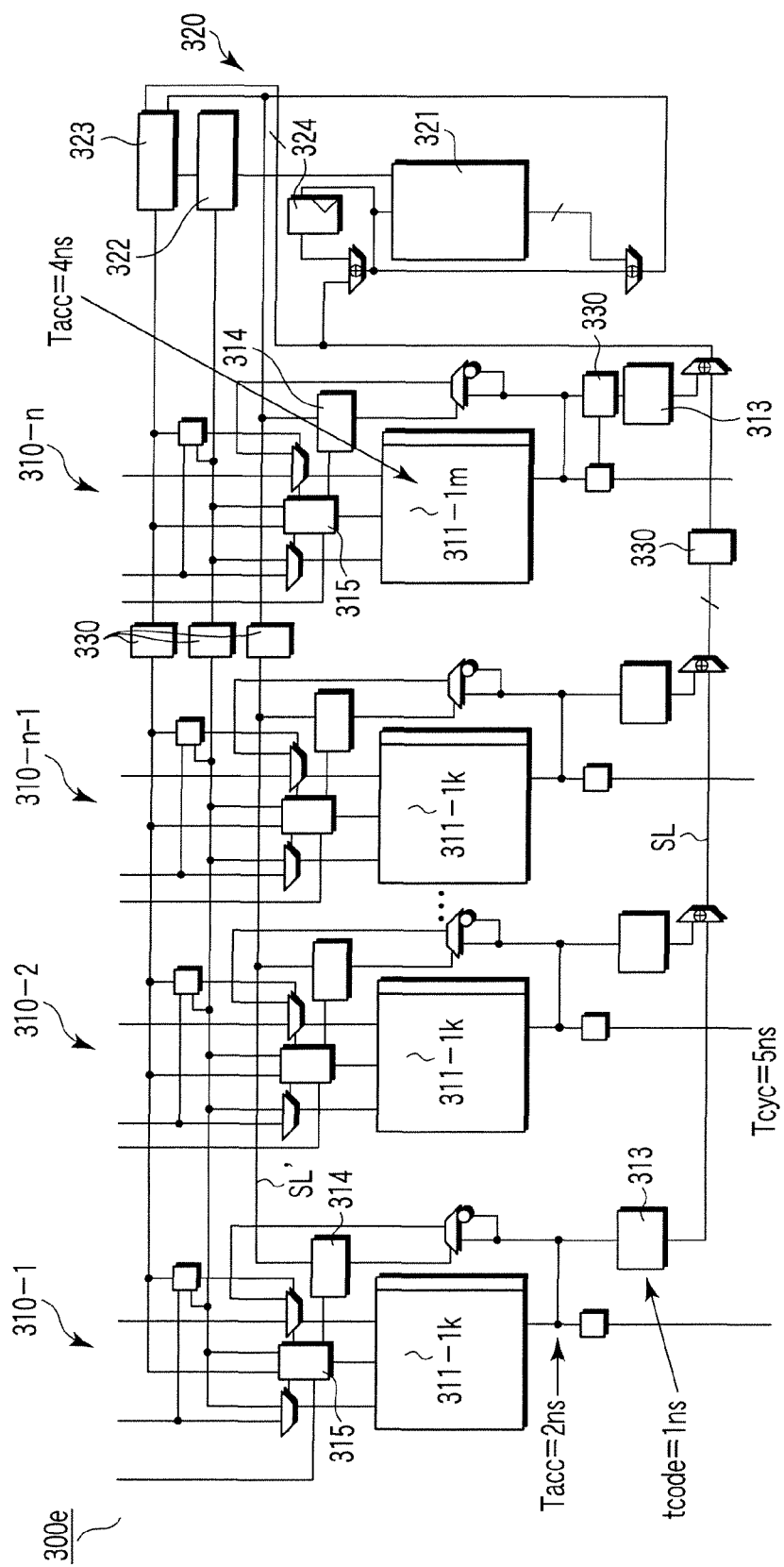
FIG. 16 is a circuit diagram showing an arrangement of an ECC memory circuit in an integrated circuit device according to a sixth embodiment of the present invention.

FIG. 16 shows a basic arrangement of an ECC memory circuit in an integrated circuit device according to a sixth embodiment of the present invention. The sixth embodiment is directed to the semiconductor integrated circuit of the first embodiment in which data stored in memory macros some of which are of different sizes can be corrected at once taking into consideration a difference in access time. The same components as those of the first embodiment are denoted by the same reference numerals and their detailed descriptions are omitted.

In the sixth embodiment, a plurality of memory circuit units $310_{-1}$, $310_{-2}$, ..., $310_{-n-1}$ and $31_{-n}$ are prepared for an ECC memory circuit 300e as shown in FIG. 16. Of these memory circuit units, for example, the memory circuit units $310_{-1}$, $310_{-2}$, ..., and $310_{-n-1}$ each include a memory macro $311_{-1k}$ whose access time (Tacc) is 2 ns. In contrast, for example, the memory circuit unit $310_{-n}$ of the final stage includes a memory macro $311_{-1m}$ whose access time is 4 ns.

In an integrated circuit device including a plurality of memory circuits, generally, there is a difference in access time among the memory circuits which is due to a memory structure and the like. A pass that extends from the output of a memory macro whose access time is the shortest to the code register of an ECC code storage unit via a partial ECC code generating circuit becomes a worst pass of the ECC memory circuit 300e. The cycle time (Tcyc) of the entire system is regulated by the worst pass.

In the sixth embodiment, a data register 330 for connecting and disconnecting a pipeline is inserted in each point of a worst path in order to prevent the cycle time from being regulated by the worst path, as shown in FIG. 16. The data register 330 is provided on each of signal lines SL and SL', which connects the memory circuit units $310_{-n-1}$ and $310_{-n}$. The long wiring of the signal lines SL and SL' easily delays the signals on the signal lines immediately after the output of the memory macro $311_{-1m}$ of the memory circuit unit $310_{-n}$. In particular, when the data register 330 is provided on each of a signal line that is supplied with the output of a state controller 323 and a signal line that is supplied with the output of an address counter 322 (these signal lines also connect the memory circuit units $310_{-n-1}$ and $310_{-n}$), a signal line for control is disconnected together with the signal lines for the state controller 323 and address counter 322. In other words, when a memory-to-memory skew caused when access time greatly varies with the memory structure is subjected to the ECC processing by the access method (code generation mode and data comparison/correction mode) as described in the first embodiment, only the path of the memory circuit unit $310_{-n}$, whose processing time is longer than the cycle time (5 ns in this example), is disconnected by the data register 330. Even though latency is lengthened, the NOP interrupt cycle of the memory macro $311_{-1m}$ is only delayed by one cycle as the entire system, and performance is hardly deteriorated.

In order to reduce the number of stages of the gates of the partial ECC code generating circuit 313 corresponding to the memory macro $311_{-1m}$ whose access time is long, the Hamming code determinant can be selected (the number of XORs can be adjusted) in accordance with the access time of each of the memory macros $311_{-1k}$ and $311_{-1m}$.

An operation of the integrated circuit device (ECC memory circuit 300e) according to the sixth embodiment will be described in more detail with reference to FIGS. 17A to 17C and 18A to 18C. As shown in FIG. 18A, the partial ECC code generating circuit 313 receives hold data (Data) and a signal (ECC processing execution signal ECC-on) from the memory macro $311_{-1m}$ and the NOP controller 315, respectively. Then, the circuit 313 transfers its output partial ECC code (Code) to the code register 324 of the ECC code storage unit 320. The adder 325a adds the output (Code-reg) of the code register 324 and the subsequent output (Code) of the circuit 313 together and supplies the added value to the code storage memory 321. In the sixth embodiment, the operation shown in FIG. 8A will be described as one in normal mode, or one to be performed when no data register is added (for the sake of brevity, an adder for adding a partial ECC code corresponding to the hold data from another memory macro $311_{-1k}$ is omitted).

Figure 17A:
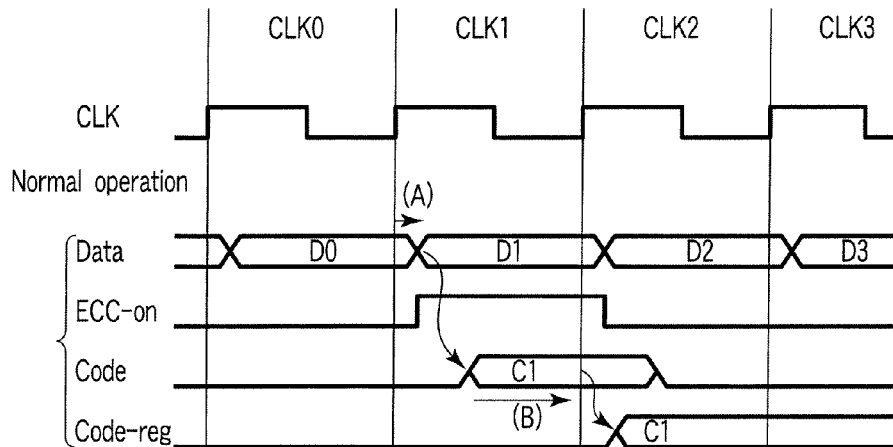
FIGS. 17A to 17C are timing charts illustrating an operation of the ECC memory circuit according to the sixth embodiment.
Figure 18A:
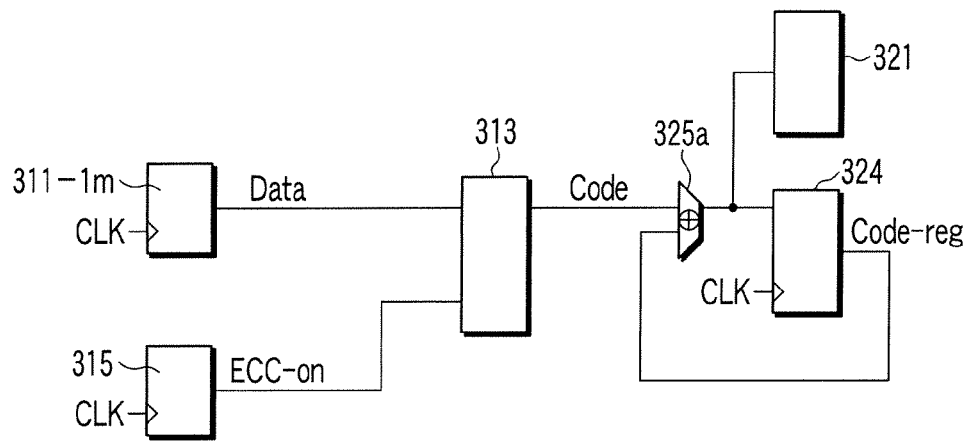
FIGS. 18A to 18C are circuit diagrams illustrating an operation of the ECC memory circuit according to the sixth embodiment.

In normal mode, as shown in FIG. 17A, the partial FCC code generating circuit 313 that receives an ECC-on signal (high level: Hi) from the NOP controller 315 generates a Code (C1) on the basis of Data (D1) output in cycle CLK1 (Hi) of a clock signal CLK. The Code (C1) is sent to the code register 324 in cycle CLK1, and then output from the code register 324 in cycle CLK2 (Hi) of the clock signal CLK.

When the access time ((A) in FIG. 17A) of the memory macro $311_{-1m}$ is fully long or when the delay in wiring ((B) in FIG. 17A) from the partial ECC code generating circuit 313 to the code register 324 is fully long, there is fear that the transfer of the Code (C1) to the code register 324 will be delayed within cycle CLK1 of the clock signal CLK. In other words, when the access time is fully long, Data (D1) of the memory macro $311_{-1m}$ is output in cycle CLK1 of the clock signal CLK as shown in FIG. 17B, but Data (D1) finally starts to be output in the latter half of cycle CLK1 of the clock signal CLK ((A)' in FIG. 17B).

Figure 18B:
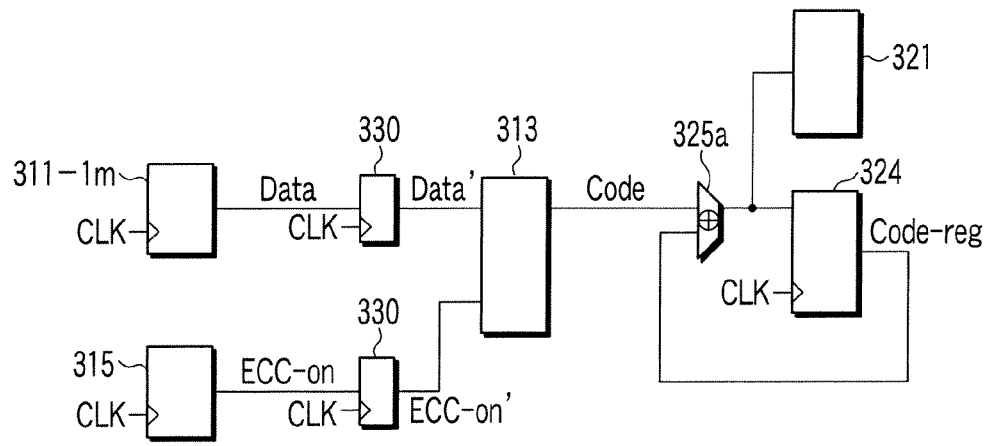

When the access time of the memory macro $311_{-1m}$ is fully long, a data register 330 is inserted between the partial ECC code generating circuit 313 and the memory macro $311_{-1m}$ as shown in FIG. 18B. In this example, a data register 330 is inserted between the partial ECC code generating circuit 313 and the NOP controller 315.

Figure 17B:
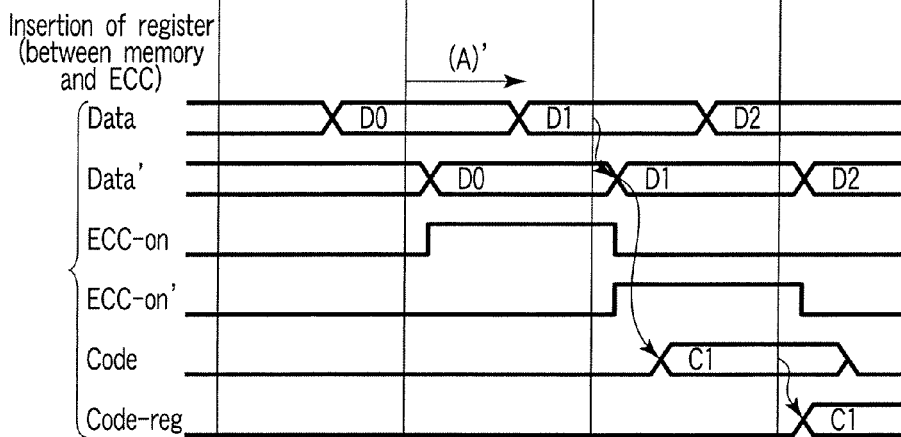

When the data register 330 is inserted, or when the access time is fully long, Data (D1) of the memory macro $311_{-1m}$ is temporarily held in the data register 330 in next cycle CLK2 of the clock signal CLK, as shown in FIG. 17B. In this cycle CLK2, Data' (D1) is output from the register 330 to the partial ECC code generating circuit 313. Similarly, ECC-on (Hi) of the NOP controller 315 is also delayed by only one cycle in the data register 330, and then output to the partial ECC code generating circuit 313 as ECC-on'. Thus, a partial ECC code is generated and Code (C1) is output in cycle CLK2 of the clock signal CLK. The Code (C1) is sent to the code register 324 in the cycle CLK2 and then output form the code register 324 in next cycle CLK3 (Hi) of the clock signal CLK.

Figure 17C:
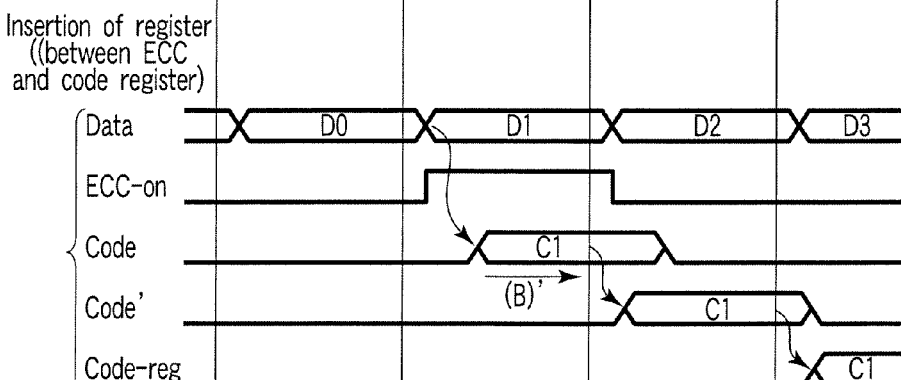
Figure 18C:
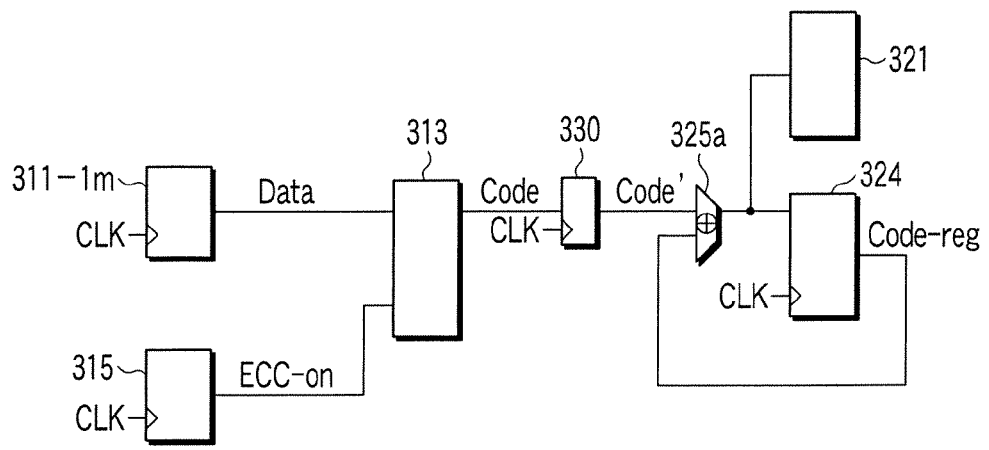

On the other hand, when the delay in wiring between the partial ECC code generating circuit 313 and the code register 324 is fully long ((B)' in FIG. 17C), a data register 330 is inserted between the circuit 313 and register 324, as shown in FIG. 18C.

When the data register 330 is inserted, or when the delay in wiring is fully long, the partial ECC code generating circuit 313 that receives an ECC-on signal (Hi) from the NOP controller 315 generates a Code (C1) on the basis of Data (D1) output in cycle CLK1 (Hi) of the clock signal CLK, as shown in FIG. 17C. The Code (C1) is sent to the data register 330 in the cycle CLK1 and temporarily held therein. Code' (C1) is output from the data register 330 to the code register 324 in next cycle CLK2 (Hi) of the clock signal CLK, and then output from the code register 324 in next cycle CLK3 (Hi) of the clock signal CLK.

If a data register 330 is added as described above, the number of cycles necessary for causing the partial ECC code (Code, Code') to reach the code register 324 is increased, which is not disadvantageous in particular. The reason is as follows. Assume that the NOP interrupt cycle occurs ten times among 100 cycles in a normal ECC memory circuit to which no data register is added. When the first NOP interrupt cycle (which occurs in the eighth cycle, for example) is used for ECC processing, a partial ECC code is output in the ninth cycle. In the ECC memory circuit 300e of the sixth embodiment to which the data register 330 is added, a partial ECC code is only output in the tenth cycle, and the remaining ninety cycles are used for latency of the next cycle and thus hardly affect the next cycle.

If the signal lines are pipelined, the constraints of the size and layout of shareable memory macros can be eliminated.

Seventh Embodiment

Figure 19:
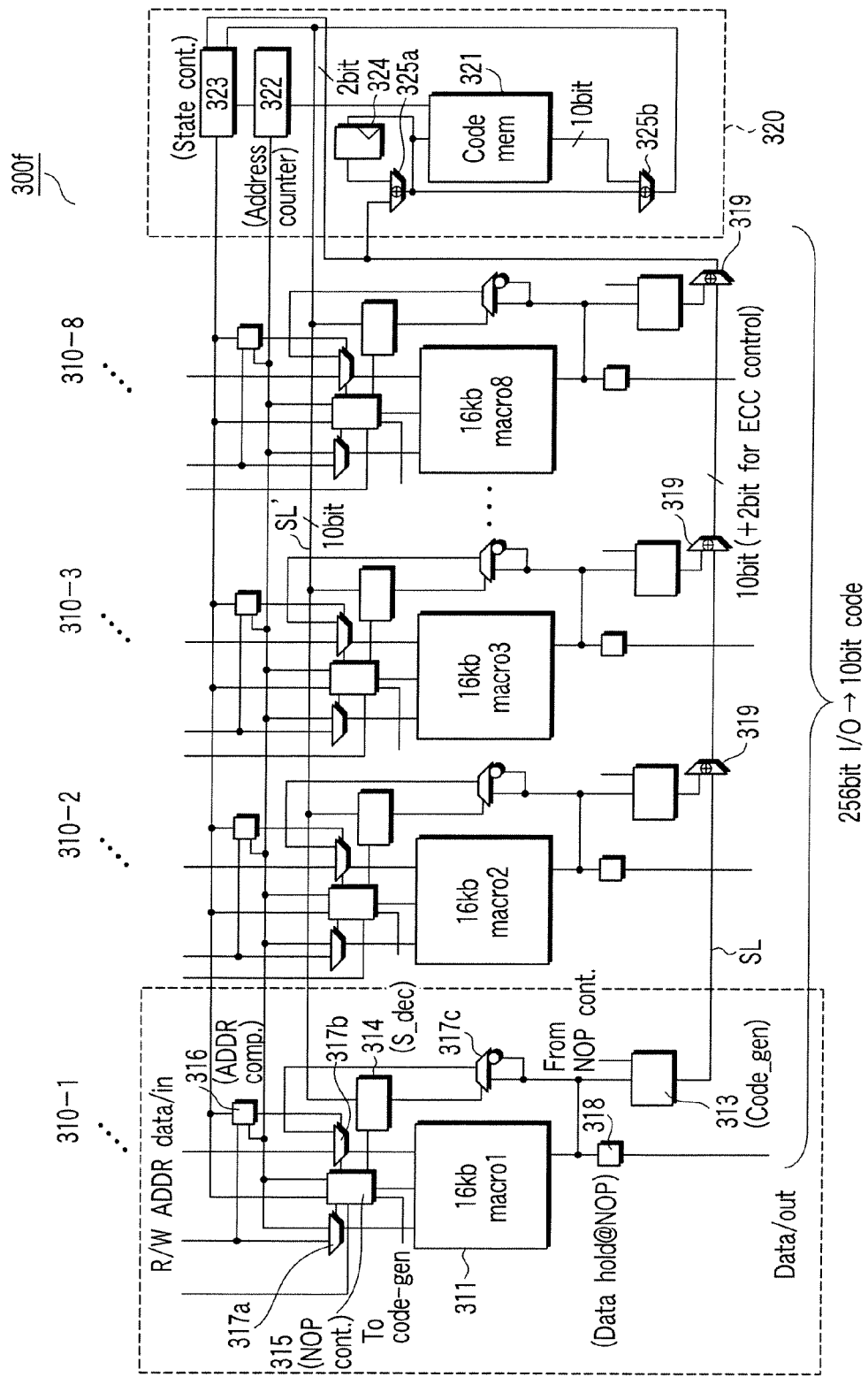
FIG. 19 is a circuit diagram showing an arrangement of an ECC memory circuit in an integrated circuit device according to a seventh embodiment of the present invention.

FIG. 19 shows a basic arrangement of an ECC memory circuit in an integrated circuit device according to a seventh embodiment of the present invention. The seventh embodiment is directed to the semiconductor integrated circuit of the first embodiment which is so configured that data stored in memory macros can be corrected at once without using any flag information. The same components as those of the first embodiment are denoted by the same reference numerals and their detailed descriptions are omitted.

In the seventh embodiment, as shown in FIG. 19, eight memory circuit units $310_{-1}$, $310_{-2}$, $310_{-3}$, ..., and $310_{-8}$ are prepared for an ECC memory circuit 300f. These eight memory circuit units have memory macros 311 of different sizes or the same size. However, each of the addresses of the memory macros 311 has no flag storing bit that is a flag storing unit. In other words, the integrated circuit device of the third embodiment is so configured that no flag storing bit is added to the address of each of the memory macros 311. It is thus impossible to control a write update history for each address when a write operation is performed.

Figure 20:
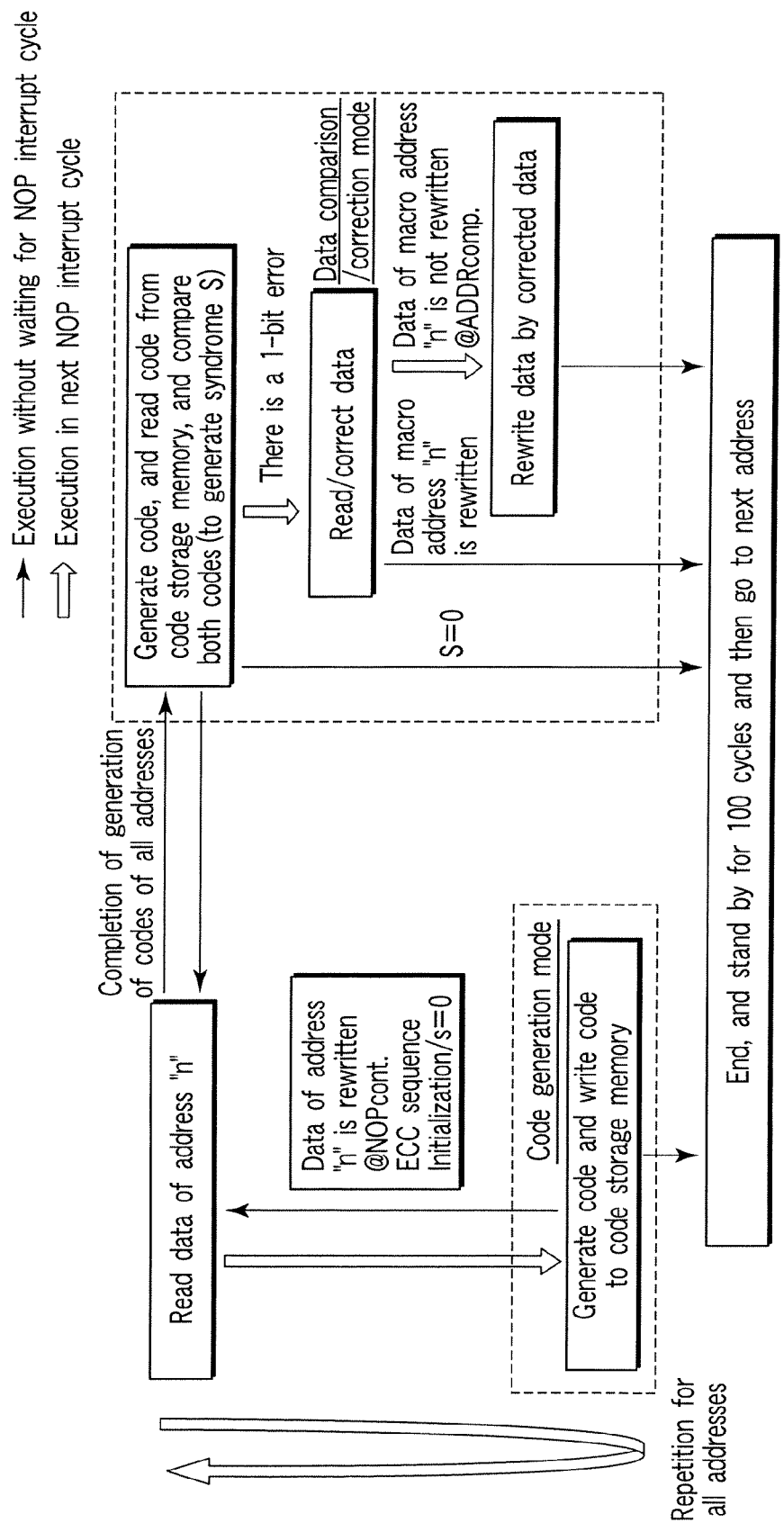
FIG. 20 is a flowchart showing a process in an ECC processing sequence according to the seventh embodiment of the present invention.

FIG. 20 is a flowchart showing an ECC processing sequence in the above-described configuration of the integrated circuit device according to the seventh embodiment. At the beginning of the sequence (at the start of ECC processing), no ECC code data corresponding to hold data is generated. The mode is therefore placed into a code generation mode after hold data of address "0" is read out.

In the code generation mode, the state controller 323 controls each NOP controller 315 to read hold data of address "0" of each memory macro 311, which corresponds to the output of the address counter 322. Then, the hold data is sent to its corresponding partial ECC code generating circuit 313 in the next NOP interrupt cycle. Under the control of the NOP controller 315, the circuit 313 generates a partial ECC code in accordance with the rule of the partial Hamming code determinant. The partial ECC code is multiplexed through the signal line SL and adders 319 and 325a and then supplied to the code register 324.

The code register 324 thus stores ECC code data corresponding to the hold data of all addresses "0." This is determined by the state controller 323 in response to a code generation end signal from each partial ECC code generating circuit 313. The ECC code data stored in the code register 324 is written to the address "0" of the code storage memory 321.

Unlike by the access method of the first embodiment (see FIG. 6), the above process is repeated for each of all addresses "0." Completing the generation of ECC code data corresponding to the hold data of all of the addresses, the code generation mode is shifted to the data comparison/correction mode under the control of the state controller 323.

In the data comparison/correction mode, a series of processes is performed by almost the same method as the access method of the first embodiment. During the series of processes, however, each NOP controller 315 monitors a write operation for a memory macro 311 corresponding to the NOP controller. If a write operation is performed for a memory macro 311, the step state of the state controller 323 is reset in place of flag information. The generation of a partial ECC code corresponding to address "0" (code generation mode) is restarted. An integrated circuit device (ECC memory circuit 300f) can thus be achieved in which all the hold data stored in each memory macro 311 can be corrected at once (ECC processing) without using flag information in the memory macro 311.

The seventh embodiment is effective particularly in a device in which the number of addresses of a memory macro is relatively small, a device in which the frequency of data write is low, and a device in which a standby state (NOP/STBY state) continues for a long time when power is turned on.

As has been described in detail, according to the seventh embodiments of the present invention, data stored in memory macros can be subjected to ECC processing at once without almost affecting any normal storage operation. Furthermore, the increase in area can be minimized, and the measures against soft errors can be taken with a high degree of freedom without depending on the size of memory macros or subjecting to the constraints of layout of the memory macros.

Figure 21:
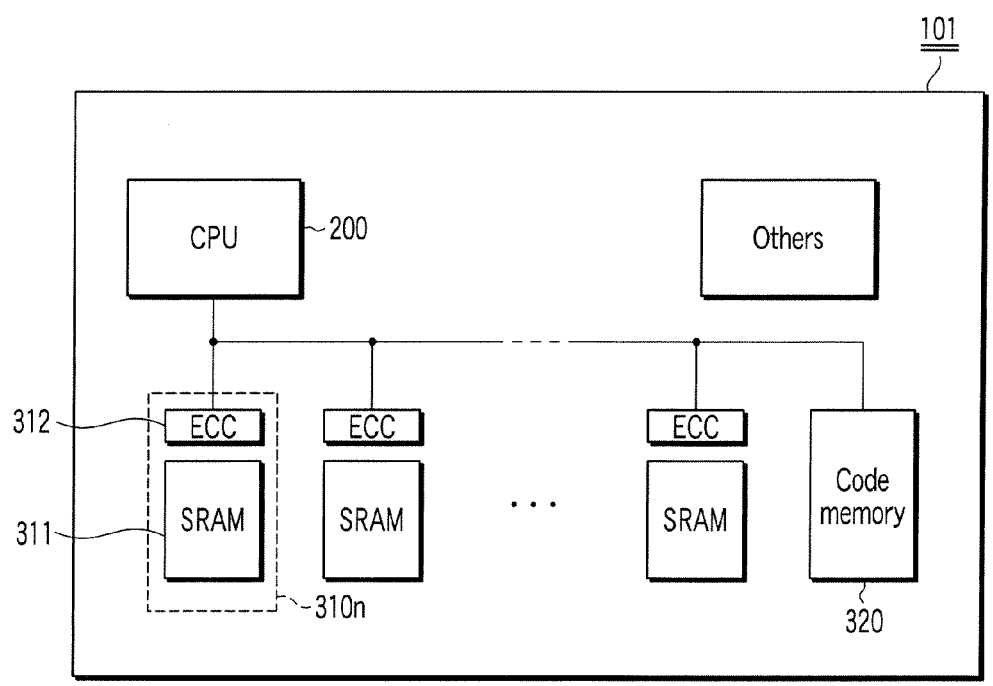
FIG. 21 is a block diagram showing a configuration of an integrated circuit system according to another embodiment of the present invention.

Each of the first to seventh embodiments is an example that is applied to a one-chip integrated circuit device. The present invention is not limited to this, but can be applied to a large-scale integrated circuit system in which a plurality of semiconductor circuits such as a CPU 200, a data storing memory macro 311 and a partial ECC code generating/decoding circuit 312 are mounted on the same printed circuit board (PCB) 101, as shown in FIG. 21. Moreover, the CPU 200 mounted on the semiconductor substrate 100 or the printed circuit board 101 need not have a plurality of memory circuit units 310n in common, but can be provided for each of the memory circuit units 310n.

According to the above embodiments, a plurality of partial ECC code generating circuits, which correspond to a plurality of memory macros having the same memory structure, generate their respective partial ECC codes in accordance with the rule of the same partial Hamming code determinant. However, any one of the partial ECC code generating circuits can selectively generate a partial ECC code.

In each of the above-described embodiments, ECC code data is stored in the code storage memory through a code register. However, the final added value output from a plurality of adders can be regarded as ECC code data, and the ECC code data can be written directly to the code storage memory.

In the foregoing embodiments, each NOP controller can be configured to control the same number of addresses as the total number of addresses of a plurality of memory circuits and selectively control a memory circuit other than the memory circuits corresponding thereto. As shown in FIG. 22, all the memory macros 311 can selectively be controlled by a single NOP controller 315.

Figure 23:
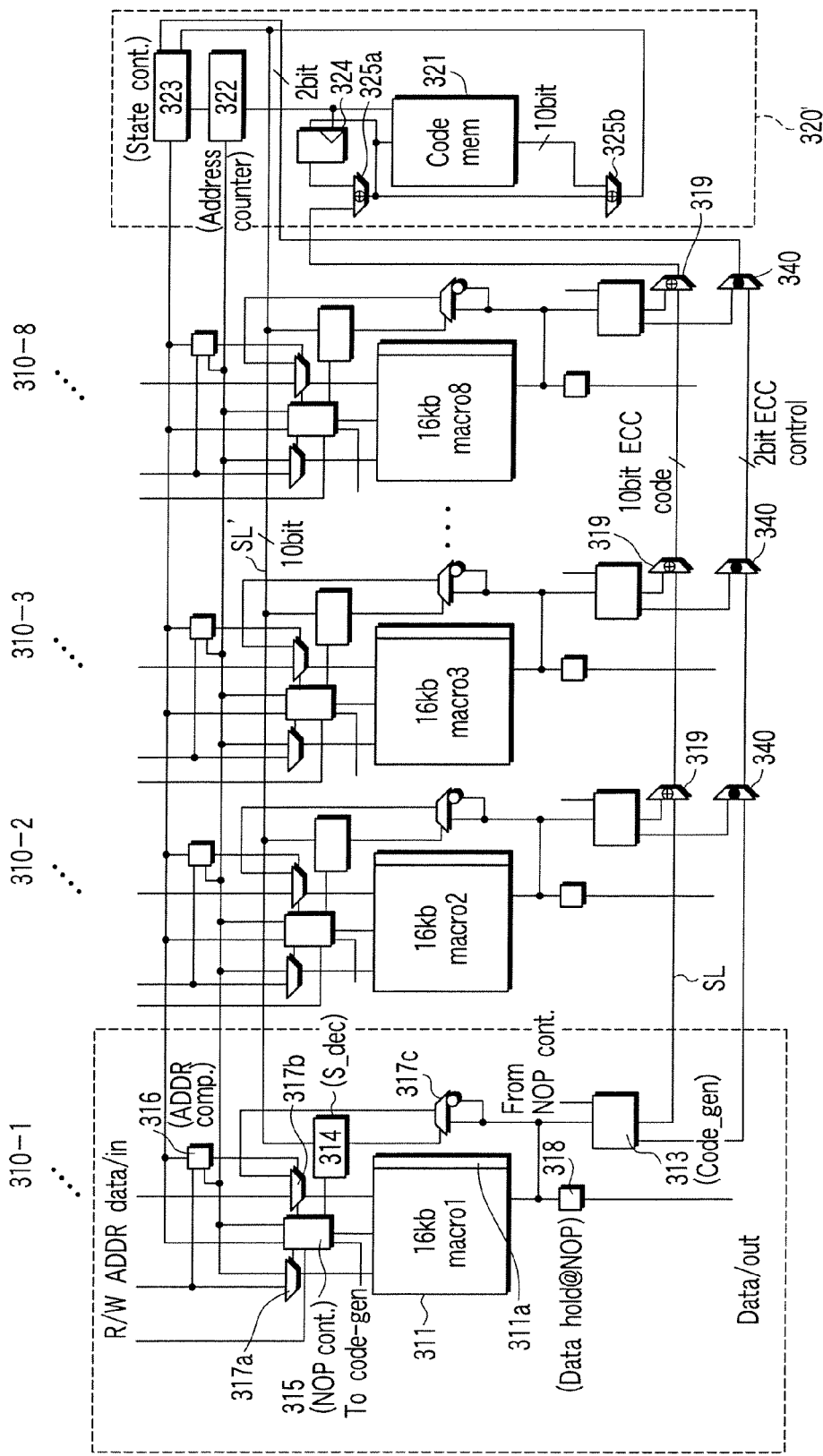
FIG. 23 is a circuit diagram showing an arrangement of an ECC memory circuit in an integrated circuit device according to still another embodiment of the present invention.

According to the above embodiments, the code storage memory 321 is controlled by the exclusive-OR value of a code generation end signal and flag information. The present invention is not limited to this. As shown in FIG. 23, an integrator (AND circuit) 340 can obtain an AND value of the output signal (code generation end signal and flag information) of each NOP controller 315 and on the basis of the AND value the state controller 323 can control the code storage memory 321 and code register 324.

In the ECC code data generating operation that is performed by rewriting hold data, as shown in FIG. 24, when the hold data of an address for generating ECC code data is rewritten by the immediately preceding write operation (fourth cycle Wn of Macro3), the rewritten hold data is not transferred to the memory. The hold data is converted into a partial ECC code by the partial ECC code generating circuit and then transferred to the code register (as flag information, "0" is written when the hold data of an address for generating ECC code data is actually rewritten (Wn after several cycles). In this case, the partial ECC code can be transferred without waiting for an NOP interrupt cycle; therefore, ECC code generating processing can be more improved in efficiency.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An integrated circuit device comprising:
a plurality of memory circuits which store data;
a plurality of code generating circuits which are provided for the memory circuits, respectively, to generate an error correction code to correct an error bit of each data stored in the memory circuits;
at least one code storage memory which is shared by the memory circuits to store code data obtained by the error correction code;
at least one decoding circuit which is provided for each of the memory circuits to detect the error bit based on the code data stored in the code storage memory;
at least one memory hibernation state control circuit to bring each of the memory circuits into a hibernation state in response to an external command;
a state controller which controls the memory hibernation state control circuit and indicates an interrupt in a memory circuit in a hibernation state; and
a plurality of correction circuits which are provided for the memory circuits, respectively, to correct the error bit detected by the decoding circuit by the interrupt in the memory circuit in the hibernation state in accordance with an indication of the state controller.

2. The integrated circuit device according to claim 1, wherein each of the memory circuits stores data into which a series of data rows having a given bit width is divided in accordance with a memory structure.

3. The integrated circuit device according to claim 2, wherein the memory circuits have a same memory structure.

4. The integrated circuit device according to claim 2, wherein the memory circuits have different memory structures.

5. The integrated circuit device according to claim 1, wherein each of the code generating circuits generates the error correction code in accordance with a rule corresponding to a procession element when an interrupt is caused in the memory circuit in the hibernation state, the procession element being formed to define a bit width of each of the memory circuits as a row and a bit width of the code data as a column, and being included in a Hamming procession which is formed to define a total of bit widths of the memory circuits as a row and a bit width of the code data stored in the code storage memory as a column.

6. The integrated circuit device according to claim 1, wherein the decoding circuit decodes the code data in accordance with a rule corresponding to a procession element when an interrupt is caused in the memory circuit in the hibernation state, the procession element being formed to define a bit width of each of the memory circuits as a row and a bit width of the code data as a column, and being included in a Hamming procession which is formed to define a total of bit widths of the memory circuits as a row and a bit width of the code data stored in the code storage memory as a column.

7. The integrated circuit device according to claim 1, wherein at least some of the memory circuits have a same memory structure, and some of the code generating circuits, which correspond to said at least some of the memory circuits, generate an error correction code in accordance with a rule corresponding to a procession element.

8. The integrated circuit device according to claim 1, further comprising a plurality of exclusive OR circuits which computes an exclusive OR value of the error correction code output from each of the code generating circuits, and wherein the exclusive OR circuits output a final exclusive OR value, and the final exclusive OR value is defined as the code data.

9. The integrated circuit device according to claim 1, wherein each of the memory circuits includes a flag storage unit which stores flag information to correspond to an address, and the flag information is set in each address of the flag storage unit when data is written to a corresponding memory circuit.

10. The integrated circuit device according to claim 9, wherein the flag information is information of one bit or a plurality of bits to check necessity to generate an error correction code by a corresponding code generating circuit when an interrupt is caused in a memory circuit in a hibernation state.

11. The integrated circuit device according to claim 1, wherein the memory hibernation state control circuit is provided for each of the memory circuits and controls addresses the number of which is equal to the number of addresses of a memory circuit corresponding to the memory hibernation state control circuit.

12. The integrated circuit device according to claim 1, further comprising a code register which holds code data corresponding to data read out of each of the memory circuits by an interrupt in the memory circuit in the hibernation state, and wherein the code register receives an AND value of output signals of the memory hibernation state control circuit as one input signal to control an output of the code register.

13. The integrated circuit device according to claim 1, further comprising a data register to connect and disconnect only a final-stage one of the memory circuits in accordance with access time corresponding to a memory structure of the final-stage one of the memory circuits and cycle time of the integrated circuit device.

14. The integrated circuit device according to claim 1, wherein at least one of the memory circuits includes a plurality of memory macros of a same size, and the memory macros are arranged close to each other.

15. The integrated circuit device according to claim 1, wherein at least some of the memory circuits have different memory structures, and each of the code generating circuits generates an error correction code in accordance with a memory structure of one memory circuit whose memory structure is largest.

16. The integrated circuit device according to claim 15, wherein a code generating circuit corresponding to other memory circuit whose memory structure is not largest generates a code bit of "0" as an error correction code of virtual memory space corresponding to a difference between the memory structure of the one memory circuit and the memory structure of the other memory circuit.

17. The integrated circuit device according to claim 1, wherein the memory circuits, the code generating circuits, the code storage memory, the decoding circuits, the memory hibernation state control circuit, the state controller, and the correction circuits are arranged in a single package.

18. The integrated circuit device according to claim 1, wherein the memory circuits, the code generating circuits, the code storage memory, the decoding circuits, the memory hibernation state control circuit, the state controller, and the correction circuits are arranged on a single printed circuit board.

19. The integrated circuit device according to claim 1, wherein:

the memory hibernation state control circuit receives a signal from the state controller and receives a signal from an address counter whose count operation is controlled by the state controller; and reading or writing of the data is controlled using an output signal of the address counter as an address input to the memory circuit, when an output signal of the state controller does not indicated an interrupt in the memory circuit in the hibernation state and the external command brings the memory circuit into a hibernation state.

20. The integrated circuit device according to claim 1, wherein the memory hibernation state control circuit is shared by the memory circuits and controls addresses the number of which is equal to a total number of addresses of the memory circuits.

* * * * *